United States Patent
Udagawa et al.

(10) Patent No.: US 6,936,863 B2
(45) Date of Patent: Aug. 30, 2005

(54) BORON PHOSPHIDE-BASED SEMICONDUCTOR LIGHT-EMITTING DEVICE, PRODUCTION METHOD THEREOF AND LIGHT-EMITTING DIODE

(75) Inventors: Takashi Udagawa, Chichibu (JP); Akira Kasahara, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/714,612

(22) Filed: Nov. 18, 2003

(65) Prior Publication Data

US 2004/0169184 A1 Sep. 2, 2004

Related U.S. Application Data

(60) Provisional application No. 60/428,716, filed on Nov. 25, 2002, provisional application No. 60/436,640, filed on Dec. 30, 2002, and provisional application No. 60/436,641, filed on Dec. 30, 2002.

(30) Foreign Application Priority Data

Nov. 18, 2002 (JP) ........................................ 2002-333208
Dec. 20, 2002 (JP) ........................................ 2002-369577
Dec. 20, 2002 (JP) ........................................ 2002-370420

(51) Int. Cl.[7] .......................... H01L 33/00; H01L 29/20
(52) U.S. Cl. .......................... 257/103; 257/76; 257/96; 257/615; 438/47
(58) Field of Search .......................... 257/13, 94, 103, 257/96, 76, 613, 615, E33.023, E33.025, E33.028, E33.033, E33.034; 438/22, 47, 930; 372/44–46

(56) References Cited

U.S. PATENT DOCUMENTS 3,022,452 A 2/1962 Williams et al.
3,054,936 A 9/1962 Williams et al.
5,042,043 A * 8/1991 Hatano et al. ................. 372/45
6,831,293 B2 * 12/2004 Udagawa ....................... 257/47
2004/0183089 A1 * 9/2004 Udagawa ..................... 257/103

FOREIGN PATENT DOCUMENTS

| JP | 49-19782 | 2/1974 |
|---|---|---|
| JP | 53-20882 | 2/1978 |
| JP | 2-288388 | 11/1990 |
| JP | 6-260680 | 9/1994 |
| JP | 10-242569 | 9/1998 |

(Continued)

OTHER PUBLICATIONS

Japanese Search Report for PCT/JP03/14597 dated Jan. 20, 2004 (Japanese language).

(Continued)

Primary Examiner—Tom Thomas
Assistant Examiner—Matthew C Landau
(74) Attorney, Agent, or Firm—Sughrue Mion, PLLC

(57) ABSTRACT

A boron phosphide-based semiconductor light-emitting device, which device includes a light-emitting member having a hetero-junction structure in which an n-type lower cladding layer formed of an n-type compound semiconductor, an n-type light-emitting layer formed of an n-type Group III nitride semiconductor, and a p-type upper cladding layer provided on the light-emitting layer and formed of a p-type boron phosphide-based semiconductor are sequentially provided on a surface of a conductive or high-resistive single-crystal substrate and which device includes a p-type Ohmic electrode provided so as to achieve contact with the p-type upper cladding layer, characterized in that a amorphous layer formed of boron phosphide-based semiconductor is disposed between the p-type upper cladding layer and the n-type light-emitting layer. This boron phosphide-based semiconductor light-emitting device exhibits a low forward voltage or threshold value and has excellent reverse breakdown voltage characteristics.

23 Claims, 4 Drawing Sheets

FOREIGN PATENT DOCUMENTS

| JP | 11-40890 | 2/1999 |
| --- | --- | --- |
| JP | 2000-133884 | 5/2000 |
| JP | 2001-168395 | 6/2001 |
| JP | 2002-270896 | 9/2002 |
| JP | 2002-368260 | 12/2002 |
| JP | 2003-23181 | 1/2003 |

OTHER PUBLICATIONS

P. Popper, et al.; "Boron phosphide, a III–V Compound of Zinc–Blende Structure"; Nature; No. 4569, May 25, 1997, p. 1075.

J. Peret; "Preparation and Properties of the Boron Phosphides"; Journal of the American Ceramic Society, vol. 47, No. 1, Jan. 1964; pp. 44–46.

Takao Takenaka et al.; "Diffusion Layers Formed in Si Substrates during the Epitaxial Growth of BP and Application to Devices"; Journal of Electrochemical Society, vol. 125, No. 4, Apr. 1978, pp. 633–636.

K. Seeger; "Semiconductor Physics, An Introduction"; Fourth Edition, Springer–Verlag Heidelberg, 1989.

K. Shohno; "Semiconductor Techniques", 9th issue, University of Tokyo Press, pp. 74–77.

T. Izumiya; "Growth of BP and GaN/BP heterostructures"; Phys. Conf. Ser., No., 129, 1993, pp. 157–162.

I. Akasaki; "Group III–V Compound Semiconductor"; Baifukan Co., Ltd., first edition, Chapter 13.

K. Shohno, et al.; "Epitaxial Growth of BP Compounds on Si Substrates Using the $B_2H_6$–$PH_3$–$H_2$ System"; Journal of Crystal Growth, 24/25, 1974, pp. 193–196.

"Epitaxial Growth of BP Single Crystal"; Shonan Institute of Technology, 24aB11, p. 150.

Y. Kumasiro, et al.; "Preparation and Electrical Properties of Boron and Boron Phosphide Films Obtained by Gas Source Molecular Beam Deposition"; Journal of Solid State Chemistry, vol. 133, 1997, pp. 269–272.

I. Akasaki; "Group III Nitride Semiconductor"; Baifukan Co., Ltd., first edition, Chapters 13 and 14.

* cited by examiner

BORON PHOSPHIDE-BASED SEMICONDUCTOR LIGHT-EMITTING DEVICE, PRODUCTION METHOD THEREOF AND LIGHT-EMITTING DIODE

CROSS-REFERENCE TO RELATED APPLICATIONS

This application is an application filed under 35 U.S.C. §111(a) claiming benefit pursuant to 35 U.S.C. §119(e)(1) of the filing date of Provisional Applications No. 60/428,716 filed Nov. 25, 2002, No. 60/436,640 filed Dec. 30, 2002 and No. 60/436,641 filed Dec. 30, 2002, pursuant to 35 U.S.C. §111(b).

BACKGROUND OF THE INVENTION

1. Field of the Invention

The present invention relates to a boron phosphide-based semiconductor light-emitting device and to a method for producing the same. More particularly, the invention relates to a boron phosphide-based semiconductor light-emitting device exhibiting a low forward voltage or threshold voltage, having excellent reverse breakdown voltage characteristics, having a high emission intensity, and having a small decrease in emission intensity caused by long-term passage of device operation current. Furthermore, the invention relates to a method for producing the boron phosphide-based semiconductor light-emitting device and to a light-emitting diode comprising the boron phosphide-based semiconductor light-emitting device.

2. Description of the Related Art

A Group III nitride semiconductor has been conventionally employed for producing nitride semiconductor devices such as light-emitting diodes (abbreviated as LEDs) and laser diodes (abbreviated as LDs). See, for example, Isamu Akasaki, "Group III Nitride Semiconductor," Dec. 8, 1999, first edition, Baifukan Co., Ltd., Chapters 13 and 14 (hereinafter referred to as "Non-Patent Document 1"). FIG. 1 shows a cross-section of a conventional and typical compound semiconductor LED fabricated from a stacked structure in which Group III nitride semiconductor layers are stacked on a crystalline substrate. Current Group III nitride semiconductor LEDs exclusively employ, as a substrate 101, sapphire ($\alpha$-$Al_2O_3$ single crystal) or a silicon carbide (chemical formula: SiC) single crystal. On a surface of the substrate 101 is provided a lower cladding layer 102 for attaining "confinement" of light and carriers in a light-emitting layer 103. The lower cladding layer 102 is generally formed of a Group III nitride having a band gap wider than that of a material for forming the light-emitting layer 103; e.g., n-type aluminum gallium nitride (chemical formula: $Al_xGa_{1-x}N$: $0 \leq x \leq 1$). See, for example, the aforementioned Non-Patent Document 1. The light-emitting layer 103 is stacked on the lower cladding layer 102. The light-emitting layer 103 is formed of a Group III nitride semiconductor layer having compositional proportions of component elements regulated so as to obtain a desired emission wavelength. For example, n-type gallium indium nitride having an appropriate indium (symbol of element: In) composition (chemical formula: $Ga_xIn_{1-x}N$: $0 \leq x \leq 1$) is generally employed for producing the light-emitting layer 103. See, for example, Japanese Patent Publication No. 55-3834. On the light-emitting layer 103, an upper cladding layer 106 formed of a Group III nitride semiconductor having a conduction type opposite to that of the lower cladding layer 102 is provided for exerting a "confinement" effect.

The light-emitting layer 103 is known to employ a quantum well structure for attaining light emission with a narrow half width in an emission spectrum and excellent monochromaticity. See, for example, Japanese Patent Application Laid-Open (kokai) No. 2000-133884. In a quantum well structure, a well layer 103a is generally formed of n-type $Ga_xIn_{1-x}N$ ($0 \leq x \leq 1$). Meanwhile, a barrier layer 103b, which is provided so as to attain "confinement" of light and carriers in the well layer 103a and attain joining to the well layer 103a, is formed of a Group III nitride semiconductor having a band gap wider than that of the well layer 103a. For example, the barrier layer is preferably formed of $Al_xGa_{1-x}N$ ($0 \leq x \leq 1$). See Japanese Patent Application Laid-Open (kokai) No. 2000-133884. The quantum well structure forming the light-emitting layer 103 is known to be classified into two types; i.e., a single quantum well (abbreviated as SQW) structure containing only a single well layer 103a, and a multiple quantum well (abbreviated as MQW) structure having a plurality of well layers 103a produced by periodically and repeatedly stacking joined pairs each consisting of one well layer 103a and one barrier layer 103b. In this connection, the light-emitting layer 103 shown in FIG. 1 has an MQW structure produced by repeatedly stacking three joined pairs each consisting of one well layer 103a and one barrier layer 103b.

As mentioned above, in a stacked structure 11 for producing conventional LEDs, an n-type conduction layer (specifically the lower cladding layer 102) is disposed on the substrate 101 side, and a p-type conduction layer serving as the upper cladding layer 106 is disposed on the surface side. Thus, the stacked structure is called a p-side-up structure. The p-side-up LED 10, which is a most typical example of Group III nitride semiconductor LEDs, is fabricated by forming a p-type Ohmic electrode 107 directly on the surface of the p-type upper cladding layer 106 so as to attain contact thereof with the layer. In order to form a p-type Ohmic electrode 107 having a low contact resistance, the p-type upper cladding layer 106 must be formed of a p-type conduction layer having high conductivity. The p-type upper cladding layer 106 has generally been conventionally formed of a GaN layer doped with magnesium (symbol of element: Mg). See the aforementioned Non-Patent Document 1. The Mg-doped GaN layer formed through vapor phase growth means has, however, high resistance in an as-grown state. Therefore, the vapor-phase-grown GaN layer must undergo cumbersome treatment such as annealing, or electron beam treatment in a vacuum, in order to form a p-type layer. See, for example, Japanese Patent Application Laid-Open (kokai) No. 53-20882, and Isamu Akasaki, "Group III–V Compound Semiconductor," May 20, 1994, first edition, Baifukan Co., Ltd., Chapter 13. There is also disclosed a technique wherein a gallium arsenide nitride (chemical formula: GaAsN) mixed-crystal layer having a narrow band gap width is provided on the surface of the upper cladding layer 106 and an Ohmic electrode is provided so as to attain contact with the mixed-crystal layer. See, for example, Japanese Patent Application Laid-Open (kokai) No. 11-40890.

Boron monophosphide (chemical formula: BP) is known to be a type of Group III–V compound semiconductor. See P. Popper et al., "Boron phosphide, a III–V Compound of Zinc-Blende Structure," (United Kingdom), Nature, May 25, 1957, No. 4569, p. 1075. Boron phosphide is an indirect-transition-type semiconductor exhibiting a relatively low efficiency of radiation recombination, which provides light emission. See K. Seeger (translated by Keiichi Yamamoto et al.), "Physics Library 61, Physics of Semiconductors (the second vol.)," 1st issue, published by Yoshioka Shoten, Jun. 25, 1991, p. 507. Therefore, a boron phosphide crystal layer has been conventionally employed not as an active layer but as another functional layer included in a semiconductor light-emitting device or a photo-detector. Specifically, a boron phosphide crystal layer having an n-conduction type (n-type boron phosphide crystal layer) has been employed as an element such as an n-type emitter layer of a heterobipolar transistor (HBT) or a window layer provided in a pn-junction silicon (Si) solar cell for transmitting sunlight. See Takao Takenaka et al., "Diffusion Layers Formed in Si Substrates during the Epitaxial Growth of BP and Application to Devices," (US), Journal of Electrochemical Society, April, 1978, Vol. 125, No. 4, p. 633–637.

A p-type crystalline layer can be produced by doping a monomeric boron phosphide (chemical formula: BP)—a type of Group III–V compound semiconductor—with magnesium (Mg). See, for example, Japanese Patent Application Laid-Open (kokai) No. 2-288388. When a light-emitting device is fabricated from a p-type boron phosphide crystalline layer, the p-type Ohmic electrode is formed of a gold-zinc (Au–Zn) alloy. See, for example, Japanese Patent Application Laid-Open (kokai) No. 10-242569. According to a conventional technique, a p-type boron phosphide crystalline layer is formed through, for example, a metal-organic chemical vapor deposition method (MOCVD) means at a high temperature of 850° C. to 1,150° C. See, for example, Japanese Patent Application Laid-Open (kokai) No. 2-288388. Meanwhile, a practically employed temperature upon vapor phase growth of n-type $Ga_xIn_{1-x}N$ ($0 \leq x \leq 1$) serving as a well layer included in the aforementioned quantum well structure is as low as 600° C. to 850° C. See, for example, Japanese Patent Application Laid-Open (kokai) No. 6-260680. Such low temperature is employed because vaporization of indium (In) from n-type $Ga_xIn_{1-x}N$ ($0 \leq x \leq 1$) serving as a well layer, which is extremely thin, is prevented at such a temperature, thereby successfully providing a well layer having an aimed for indium composition.

Meanwhile, boron monophosphide tends to form a p-type conductive layer rather than an n-type conductive layer, because the effective mass of a hole is smaller than that of an electron. See Japanese Patent Application Laid-Open (kokai) No. 2-288388. In contrast to this, a Group III nitride semiconductor such as $Al_xGa_yIn_zN$ ($0 \leq x, y, z \leq 1$, $x+y+z=1$) tends to readily form an n-type conductive layer and encounters difficulty in forming a low-resistive p-type conductive layer in an as-grown state.

A conventional technique encounters difficulty in satisfactory formation of a low-resistive p-type boron phosphide crystal layer on an underlying layer such as a Group III nitride semiconductor layer. One known method for forming a boron phosphide crystal layer having a p-conduction type (p-type boron phosphide crystal layer) is the hydride VPE method, which employs sources such as diborane (molecular formula: $B_2H_6$) and phosphine (molecular formula: $PH_3$). See Katsufusa Shohno, "Semiconductor Techniques (the first vol.)," 9th issue, University of Tokyo Press, Jun. 25, 1992, p. 76–77. In the hydride method, a p-type boron phosphide crystal layer can be formed through feeding of a boron source and a phosphorus source to a vapor phase growth zone by controlling a concentration ratio of a phosphorus source to a boron source; i.e., a V/III ratio, to a low ratio. See ibid. However, as the V/III ratio must be controlled to a low level as required by the method, a high-resistance poly-crystal such as $B_nP$ ($7 \leq n \leq 10$), which does not exhibit a semiconductor property, is formed, thereby causing difficulty in successful formation of a low-resistive p-type boron phosphide crystal layer. See ibid.

When such a conventional technique is employed, successful formation of a low-resistive p-type boron phosphide crystal layer, without being affected by the identity of underlying layer, tends to be difficult. In addition, in most cases, conventional techniques have employed a silicon (Si) single crystal as an underlying layer on which a p-type boron phosphide crystal layer is formed (see ibid). Heretofore, no technique has been reported for successfully forming a low-resistive p-type boron phosphide crystal layer on a crystalline underlying layer other than a silicon single crystal; e.g., an n-type Group III nitride semiconductor layer.

SUMMARY OF THE INVENTION

In order to produce a light-emitting device operable at a lowered forward voltage (Vf) or a reduced threshold voltage (Vth), a technique for forming a low contact resistance Ohmic electrode is also a critical issue. With regard to a p-side-up type light-emitting device, a particularly essential issue is the method of forming a p-type Ohmic electrode so as to attain contact with a low-resistive p-type conduction layer. Instead of using a conventional Group III nitride semiconductor layer which requires cumbersome operations so as to form a low-resistive p-type conduction layer, one conceivable measure is formation of a p-type upper cladding layer from the aforementioned magnesium (Mg)-doped p-type boron phosphide semiconductor crystalline layer. For example, there can be employed a technique including forming a magnesium (Mg)-doped p-type boron phosphide crystalline layer serving as an upper cladding layer on a light-emitting layer included in a quantum well structure formed of stacked thin layers and forming a p-type Ohmic electrode so as to attain contact with the upper cladding layer, thereby producing a p-side-up type light-emitting device.

However, as in the aforementioned conventional technique, the suitable vapor phase growth temperature for forming a well layer included in the light-emitting layer having a quantum well structure greatly differs from that for forming a p-type boron phosphide layer. Therefore, when the p-type boron phosphide layer is vapor-phase grown at high temperature, variation in indium content in an indium-containing nitride semiconductor layer serving as the well layer is induced. The variation in indium content means generally a decrease in indium content, which reduces stability of quantum levels in the well layer. The decrease in stability disturbs successful production of a boron phosphide-based semiconductor light-emitting device for emitting light of excellent monochromaticity having a narrow half width in terms of a desired wavelength. In addition, a junction barrier difference between a well layer and a barrier layer (e.g., a GaN barrier layer) decreases, thereby failing to attain a satisfactory "confinement" effect of light and carriers, thereby inhibiting provision of a boron phosphide-based semiconductor light-emitting device emitting high-intensity light.

At present, even though a readily formable p-type boron phosphide semiconductor layer is simply provided on a light-emitting layer having a quantum well structure including Group III nitride semiconductor thin layers, a boron phosphide-based semiconductor light-emitting device having excellent electrical and emission characteristics cannot be successfully produced. This is attributed to the fact that a decisive technique has yet to be established for suitably forming a pn-junction between a p-type boron phosphide semiconductor layer and an n-type light-emitting layer included in a quantum well structure formed of a Group III nitride semiconductor. In particular, as a barrier layer and a well layer included in a quantum well structure are thin layers having a thickness of about some tens of nm or some nm, a technique for joining a p-type boron phosphide semiconductor layer serving as an upper cladding layer to such thin film without thermally deteriorating the thin layers is required.

In order to solve the above-mentioned problem, the present invention is directed to the following.

(1) A boron phosphide-based semiconductor light-emitting device, which device includes a light-emitting member having a hetero-junction structure in which an n-type lower cladding layer formed of an n-type compound semiconductor, an n-type light-emitting layer formed of an n-type Group III nitride semiconductor, and a p-type upper cladding layer provided on the light-emitting layer and formed of a p-type boron phosphide-based semiconductor are sequentially provided on a surface of a conductive or high-resistive single-crystal substrate and which device includes a p-type electrode provided so as to achieve contact with the p-type upper cladding layer, characterized in that a amorphous layer formed of boron phosphide-based semiconductor is disposed between the p-type upper cladding layer and the n-type light-emitting layer.

(2) A boron phosphide-based semiconductor light-emitting device as described in (1), wherein the amorphous layer has a multilayer structure comprising a first amorphous layer being in contact with the light-emitting layer and a second amorphous layer being in contact with the p-type upper cladding layer and having a carrier concentration higher than that of the first amorphous layer.

(3) A boron phosphide-based semiconductor light-emitting device as described in (2), wherein the first amorphous layer is formed of a boron phosphide-based semiconductor grown at a temperature lower than the temperature at which the light-emitting layer is formed.

(4) A boron phosphide-based semiconductor light-emitting device as described in (2) or (3), wherein the first amorphous layer is formed of an undoped boron phosphide and has a thickness of 2 nm to 50 nm.

(5) A boron phosphide-based semiconductor light-emitting device as described in (2), wherein the second amorphous layer is formed of a p-type boron phosphide-based semiconductor grown at a temperature higher than the temperature at which the first amorphous layer is formed.

(6) A boron phosphide-based semiconductor emitting device as described in (2), wherein the second amorphous layer is formed of an undoped amorphous p-type boron phosphide having an acceptor concentration at room temperature of $2\times10^{19}$ $cm^{-3}$ to $4\times10^{20}$ $cm^{-3}$, a carrier concentration at room temperature of $5\times10^{18}$ $cm^{-3}$ to $1\times10^{20}$ $cm^{-3}$, and a thickness of 2 nm to 450 nm.

(7) A boron phosphide-based semiconductor light-emitting device as described in (1), wherein the p-type upper cladding layer is formed of a p-type boron phosphide-based semiconductor having a dislocation density equal to or less than that of the Group III nitride semiconductor serving as the light-emitting layer.

(8) A boron phosphide-based semiconductor light-emitting device as described in (1), wherein the p-type upper cladding layer is formed of an undoped polycrystalline p-type boron phosphide having an acceptor concentration at room temperature of $2\times10^{19}$ $cm^{-3}$ to $4\times10^{20}$ $cm^{-3}$, a carrier concentration at room temperature of $5\times10^{18}$ $cm^{-3}$ to $1\times10^{20}$ $cm^{-3}$, and a resistivity at room temperature of 0.1 Ω·cm or less.

(9) A boron phosphide-based semiconductor light-emitting device as described in (1), wherein the p-type electrode provided on the p-type upper cladding layer is formed of a bottom-side electrode and a p-type Ohmic electrode; the bottom-side electrode in contact with the surface of the p-type upper cladding layer and being formed of a material able to form non-Ohmic contact with the p-type boron phosphide-based semiconductor serving as the p-type upper cladding layer; and the p-type Ohmic electrode being in electrical contact with the bottom-side electrode, extending so as to achieve contact also with the surface of the p-type upper cladding layer, and being in Ohmic contact with the p-type boron phosphide-based semiconductor.

(10) A boron phosphide-based semiconductor light-emitting device as described in (9), wherein the p-type Ohmic electrode is provided so as to extend, as a stripe electrode, on a portion of the surface of the p-type upper cladding layer where the bottom-side electrode is not provided.

(11) A boron phosphide-based semiconductor light-emitting device as described in (9), wherein the bottom-side electrode is formed of a gold-tin (Au—Sn) alloy or a gold-silicon (Au—Si) alloy.

(12) A boron phosphide-based semiconductor light-emitting device as described in (9), wherein the bottom-side electrode is formed of titanium (Ti).

(13) A boron phosphide-based semiconductor light-emitting device as described in (9), wherein the p-type Ohmic electrode is formed of a gold-beryllium (Au—Be) alloy or a gold-zinc (Au—Zn) alloy.

(14) A boron phosphide-based semiconductor light-emitting device as described in (9), wherein the p-type Ohmic electrode is formed of nickel (Ni) or a compound thereof.

(15) A boron phosphide-based semiconductor light-emitting device as described in (9), wherein an intermediate layer formed of a transition metal is provided between the p-type Ohmic electrode and the bottom-side electrode.

(16) A boron phosphide-based semiconductor light-emitting device as described in (15), wherein the intermediate layer is formed of molybdenum (Mo) or platinum (Pt).

(17) A method for producing a boron phosphide-based semiconductor light-emitting device, the method including forming a light-emitting member having a hetero-junction structure in which an n-type lower cladding layer composed of an n-type compound semiconductor, an n-type light-emitting layer composed of an n-type Group III nitride semiconductor, and a p-type upper cladding layer composed of a p-type boron phosphide-based semiconductor and provided on the light-emitting layer are sequentially provided on a surface of a conductive or high-resistive single-crystal substrate, and forming a p-type Ohmic electrode so as to achieve contact with the p-type upper cladding layer, characterized in that the method comprises forming an amorphous layer composed of a boron phosphide-based semiconductor on the n-type light-emitting layer through a vapor phase growth method, and forming the p-type upper cladding layer composed of a p-type boron phosphide-based semiconductor layer on the amorphous layer through a vapor phase growth method.

(18) A method for producing a boron phosphide-based semiconductor light-emitting device, the method including forming a light-emitting member having a hetero-junction structure in which an n-type lower cladding layer composed of an n-type compound semiconductor, an n-type light-emitting layer composed of an n-type Group III nitride semiconductor, and a p-type upper cladding layer composed of a p-type boron phosphide-based semiconductor and provided on the light-emitting layer are sequentially provided on a surface of a conductive or high-resistive single-crystal substrate, and forming a p-type Ohmic electrode so as to achieve contact with the p-type upper cladding layer, characterized in that the method comprises forming a first amorphous layer composed of boron phosphide-based semiconductor on the n-type light-emitting layer through a vapor phase growth method; forming a second amorphous layer composed of amorphous p-type boron phosphide-based semiconductor having a carrier concentration higher than that of the first amorphous layer through a vapor phase growth method such that the second amorphous layer is joined to the first amorphous layer; and forming the p-type upper cladding layer composed of a p-type boron phosphide-based semiconductor layer through a vapor phase growth method such that the upper cladding layer is joined to the second amorphous layer.

(19) A method for producing a boron phosphide-based semiconductor light-emitting device as described in (18), wherein the first amorphous layer is formed on the n-type light-emitting layer maintained at a temperature higher than 250° C. and lower than 750° C. through a vapor phase growth method at a concentration ratio of a boron-containing compound as a boron source to a phosphorus-containing compound as a phosphorus source fed to a vapor phase growth zone (V/III ratio) falling within a range of 0.2 to 50.

(20) A method for producing a boron phosphide-based semiconductor light-emitting device as described in (18), wherein the second amorphous layer is vapor-phase grown on the first amorphous layer maintained at a temperature of 1000° C. to 1250° C. at a V/III ratio higher than that employed in vapor phase growth of the first amorphous layer.

(21) A method for producing a boron phosphide-based semiconductor light-emitting device as described in (17) or (18), wherein the p-type upper cladding layer is vapor-phase grown at a temperature of 750° C. to 1200° C. at a V/III ratio falling within a range of 600 to 2,000.

(22) A method for producing a boron phosphide-based semiconductor light-emitting device as described in (18), wherein each of the first amorphous layer, the second amorphous layer, and the p-type upper cladding layer is composed of boron phosphide (BP).

(23) A light-emitting diode comprising a boron phosphide-based semiconductor light-emitting device as described in any one of (1) to (16).

DETAILED DESCRIPTION OF THE INVENTION

Figure 1:
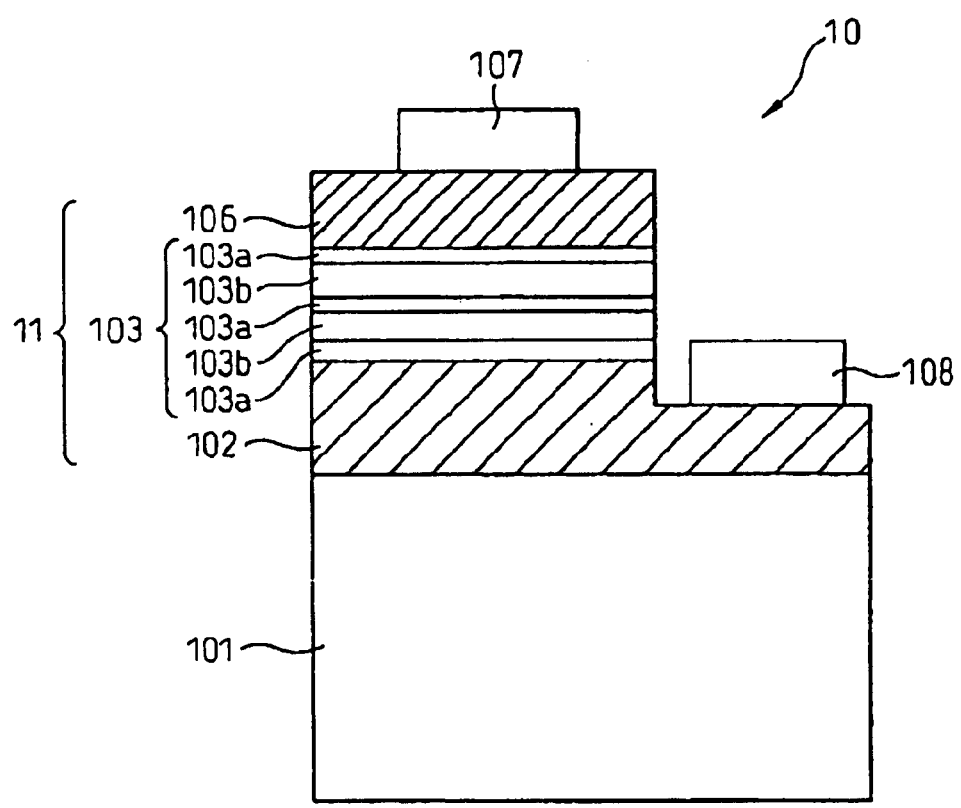
FIG. 1 is a schematic cross-sectional view of a conventional LED.

The stacked structure for producing the boron phosphide-based semiconductor light-emitting device according to the present invention is formed such that silicon (Si) single crystal, a Group III–V compound semiconductor single crystal (e.g., gallium nitride (GaN), or gallium phosphide (GaP)) or an oxide single crystal (e.g., sapphire ($Al_2O_3$ single crystal)) serves as a substrate. When a p-side-up stacked structure is provided on a conductive single-crystal substrate, an n-type conductive substrate is preferably employed. For example, a phosphorus (P)-doped n-type silicon single-crystal substrate can be employed.

An n-type lower cladding layer is provided on a surface of the single-crystal substrate. The n-type lower cladding layer is deposited, for example, through vapor phase growth means such as the metal-organic chemical vapor deposition method (MOCVD). In a p-side-up light-emitting device, a lower cladding layer provided between the single-crystal substrate and the light-emitting layer is preferably formed of an n-type low-resistive conductive layer having a resistivity (specific resistance) at room temperature of 1 Ω·cm or less. The n-type lower cladding layer is formed of an n-type compound semiconductor, and is formed of, for example, a Group III–V compound semiconductor such as an n-type gallium nitride. In particular, a low-resistive n-type boron phosphide having a resistivity less than 0.1 Ω·cm is preferably used to form an n-type lower cladding layer.

A light-emitting layer is provided on the lower cladding layer. The light-emitting layer is formed of an n-type Group III nitride semiconductor. The light-emitting layer can be stacked through vapor phase growth means. The light-emitting layer is formed from a semiconductor material having a forbidden band gap corresponding to a desired emission wavelength. For example, a blue-light-emitting layer may be formed of direct-transition-type gallium indium nitride (compositional formula: $Ga_xIn_{1-x}N$: 0<x<1) or gallium nitride phosphide (compositional formula: $GaN_yP_{1-y}$: 0<y<1). Through appropriate selection of compositional proportions of indium (In) and phosphorus (P) (i.e., 1-x and 1-y), a light-emitting layer for emitting light of a wavelength falling within a near ultraviolet region or a green light region can also be provided. For example, by use of wurtzite-type gallium nitride mixed crystals, an n-type conductive layer can be formed more readily than a p-type conductive layer, in accordance with the degenerated structure of the valence band of the semiconductor material. Thus, a Group III nitride semiconductor such as n-type $Ga_xIn_{1-x}N$ ($0 \leq x \leq 1$) can be utilized as a material to form an n-type light-emitting layer.

The light-emitting layer has preferably a quantum well structure having one or more well layers and one or more barrier layers. The quantum well structure enables light emission with a narrow half width in an emission spectrum and excellent monochromaticity. The quantum well structure may be a single quantum well (SQW) structure containing only a single well layer, or a multiple quantum well (MQW) structure having a plurality of well layers produced by periodically and repeatedly stacking joined couples each consisting of one well layer and one barrier layer.

A p-type upper cladding layer having a conduction type opposite that of an n-type lower cladding layer is provided on the n-type light-emitting layer. The p-type upper cladding layer is formed from a p-type boron phosphide-based semiconductor instead of a Group III nitride semiconductor, which encounters difficulty in readily providing a low-resistive p-type conductive layer, because of the aforementioned valence band structure. The p-type upper cladding layer is preferably formed of boron monophosphide (BP). Particularly, the upper cladding layer is formed of polycrystalline boron phosphide.

According to the present invention, an upper cladding layer formed of a p-type boron phosphide-based semiconductor is formed on the light-emitting layer, with an amorphous layer formed of a boron phosphide-based semiconductor intervening between the two layers.

The boron phosphide-based semiconductor refers to a cubic zincblende-type Group III–V compound semiconductor containing boron (symbol of element: B) and phosphorus (symbol of element: P). Specific examples include $B_\alpha Al_\beta Ga_\gamma In_{1-\alpha-\beta-\gamma} P_{1-\delta} As_\delta$ ($0<\alpha\leq 1$, $0\leq\beta<1$, $0\leq\gamma<1$, $0<\alpha+\beta+\gamma\leq 1$, $0\leq\delta<1$) and $B_\alpha Al_\beta Ga_\gamma In_{1-\alpha-\beta-\gamma} P_{1-\delta} N_\delta$ ($0<\alpha\leq 1$, $0\leq\beta<1$, $0\leq\gamma<1$, $0<\alpha+\beta+\gamma\leq 1$, $0\leq\delta<1$). More specifically, the semiconductor is monomeric boron phosphide (BP), boron gallium indium phosphide (compositional formula: $B_\alpha Ga_\gamma In_{1-\alpha-\gamma} P$: $0<\alpha\leq 1$, $0\leq\gamma<1$), or a mixed-crystal compound containing a plurality of Group V element species such as boron nitride phosphide (compositional formula: $BP_{1-\delta} N_\delta$: $0\leq\delta<1$) or boron arsenide phosphide (compositional formula: $B_\alpha P_{1-\delta} As_\delta$). In particular, monomeric boron phosphide (BP) is an essential element of boron phosphide-based semiconductor mixed-crystals, and boron phosphide-based mixed-crystals having a wide band gap can be formed from a BP having a wide band gap serving as a basic constituent.

The amorphous layer formed of boron phosphide can be vapor-phase grown through the halogen method (see "Journal of the Japanese Association for Crystal Growth," Vol. 24, No. 2, (1997), p. 150) by use of sources such as boron trichloride (molecular formula: $BCl_3$) and phosphorus trichloride (molecular formula: $PCl_3$). Alternatively, vapor phase growth can also be performed through the hydride method (see J. Crystal Growth, 24/25 (1974), p. 193–196) by use of sources such as borane (molecular formula: $BH_3$) or diborane (molecular formula: $B_2H_6$), and phosphine (molecular formula: $PH_3$), or through molecular beam epitaxy (see J. Solid State Chem., 133 (1997), p. 269–272). Metal-organic chemical vapor deposition (MOCVD) (see Inst. Phys. Conf. Ser., No. 129 (IOP Publishing Ltd. (UK, 1993), p. 157–162) employing an organic boron compound and a phosphorus hydride as sources can also be employed.

MOCVD is a particularly advantageous growth method for growing the amorphous layers at low temperature, since a highly decomposable substance such as triethylborane (molecular formula: $(C_2H_5)_3B$) is employed as a boron source. Specifically, the growth is performed through atmospheric pressure (near atmospheric pressure) or reduced-pressure MOCVD employing a triethylborane/phosphine (molecular formula: $PH_3$)/hydrogen ($H_2$) reaction system at 250° C. to 1,200° C. When the temperature is higher than 1,200° C., poly boron phosphide crystals such as $B_{13}P_2$ tend to be formed (see J. Am. Ceramic Soc., 47(1) (1964), p. 44–46), thereby failing to attain successful formation of an amorphous layer formed of monomeric boron phosphide. When the temperature is higher than 750° C., a polycrystalline layer containing boron and phosphorus tends to be readily formed. In such high-temperature growth, an amorphous layer can be formed by reducing a supply ratio of the amount of phosphorus to the amount of boron; i.e., V/III, to a low level. Specifically, when the V/III ratio ($=(C_2H_5)_3B/PH_3$ supply concentration ratio) is controlled to a low level falling within a range of 0.2 to 50 in MOCVD employing the above reaction system, an amorphous layer can be successfully formed at comparatively high temperature.

When the light-emitting layer has a quantum well structure, the amorphous layer formed of a boron phosphide-based semiconductor can be provided on any of the barrier layer or the well layer serving as the uppermost surface end (final end) of the quantum well structure (i.e., the light-emitting layer). Most preferably, there is employed a stacked structure in which the amorphous layer is provided so as to attain joining to the barrier layer serving as the final end. The barrier layer serving as the final end, when provided so as to be joined to the well layer, serves as a coating layer for the well layer and effectively prevents loss of the well layer caused by, for example, sublimation during vapor phase growth of an amorphous boron phosphide-based semiconductor layer. Through employment of the technique for providing an amorphous boron phosphide-based semiconductor layer at a temperature equal to or lower than the vapor phase growth temperature at which a Group III nitride semiconductor layer serving as a barrier layer or a well layer is formed, thermal deterioration of the well layer caused by condensation of elements such as indium (In) can be prevented. Particularly when the vapor phase growth is performed at a temperature lower than the well layer growth temperature, thermal deterioration of the barrier layer as well as the well layer can be effectively avoided. However, as mentioned above, a temperature lower than 250° C. is not suited for forming an amorphous boron phosphide-based semiconductor layer, from the viewpoint of poor thermal decomposition efficiency of element sources, although the amorphous boron phosphide-based semiconductor layer is preferably vapor-phase grown at a temperature lower than the barrier layer growth temperature and well layer growth temperature.

Notably, the thickness of amorphous layer can be directly determined through, for example, observation under a transmission electron microscope (TEM). Whether or not the formed layer is amorphous can be determined on the basis of electron-beam diffraction patterns or X-ray diffraction patterns. An amorphous layer will exhibit a halo electron diffraction pattern. The stoichiometric ratio of phosphorus to boron, the two elements forming the amorphous layers, is determined from quantitative elemental measurements of boron and phosphorus on the basis of, for example, Auger electron spectroscopy.

The amorphous layer may have a single layer structure or a multilayer structure having two or more layers. When the amorphous layer has a multilayer structure, an amorphous layer which is in contact with the light emitting layer is, hereinafter, referred to as a first amorphous layer, and an amorphous layer which is in contact with the upper cladding layer is referred to as a second amorphous layer.

In order to form the first amorphous layer which is tightly and uniformly joined to the light-emitting layer, the V/III ratio is preferably controlled to a relatively high level falling within the aforementioned range. For example, the amorphous layer is formed at a V/III ratio of 45. The amorphous boron phosphide layer formed at a comparatively high V/III ratio assumes a high-resistance layer having a carrier (hole) concentration of $5\times 10^{17}$ cm$^{-3}$ or less. In other words, the first amorphous layer tightly joined to the light-emitting layer is suitably formed of a high-resistance layer containing boron and phosphorus at a stoichiometric composition.

The first amorphous layer provides "adsorption sites" for growing the second amorphous layer, thereby promoting uniform vapor phase growth. In order to promote uniform growth of the second amorphous layer, the first amorphous layer preferably has a thickness of about 1 nm or more, more preferably of 20 nm to 50 nm, which is sufficient to uniformly and sufficiently cover the surface of the light-emitting layer. From another aspect, the first amorphous layer preferably has a thickness of 50 nm or less so as to successfully permit passage of operation current for driving a light-emitting device, as the first amorphous layer has a relatively high resistance as mentioned above. Furthermore, the first amorphous layer preferably has a thickness of 5 nm to 20 nm. The thickness of the first amorphous layer is controlled by regulating the time of feeding a boron source to a growth zone.

When an additional second amorphous layer formed of a boron phosphide-based semiconductor is provided on the aforementioned first amorphous layer through vapor phase growth at a temperature higher than the first amorphous layer growth temperature, a low-resistive p-type boron phosphide-based semiconductor single-crystal layer can be readily formed on the second amorphous layer in an as grown state. The second amorphous layer contributing to provide a low-resistive p-type boron phosphide-based semiconductor single-crystal layer at room temperature is preferably formed of a boron phosphide-based semiconductor layer which is stoichiometrically rich in a Group III element such as boron with respect to a Group V element such as phosphorus. The second amorphous layer which is stoichiometrically rich in boron can be formed suitably at a temperature higher than the lower first amorphous layer growth temperature. According to one specific method, a first amorphous layer is formed on the light-emitting layer at 350° C. to 650° C. and, subsequently, a second amorphous layer is formed at 1,000° C. to 1,200° C., to thereby provide an amorphous layer serving as an underlying layer for forming a low-resistive p-type boron phosphide-based semiconductor single-crystal layer in an as-grown state. Although there is a technique in which two amorphous layers are formed by changing the vapor phase growth means, a more readily practiced and convenient technique includes formation of a first amorphous layer on the light-emitting layer, followed by formation of a second amorphous layer serving as an underlying layer for producing a p-type boron phosphide-based semiconductor single-crystal layer. When the second amorphous layer serving as an underlying layer for producing a p-type boron phosphide-based semiconductor single-crystal layer is formed at a relatively high temperature, the first amorphous layer provided so as to attain joining to the light-emitting layer serves as a protective layer which can prevent thermal decomposition of the light-emitting layer.

A second amorphous layer formed of a p-type boron phosphide-based semiconductor is stacked on the first amorphous layer. The second amorphous layer, which is tightly joined to the light-emitting layer by virtue of the action of the first amorphous layer, is effective for providing a p-type boron phosphide crystalline layer. The second amorphous layer formed of boron phosphide can also be formed through the aforementioned vapor phase growth method. In order to effectively provide a p-type upper cladding layer, the second amorphous layer is preferably formed of a p-type amorphous boron phosphide conductive layer which is stoichiometrically rich in boron with respect to phosphorus. The amorphous boron phosphide layer stoichiometrically rich in boron can be formed by controlling the V/III ratio to a lower level during vapor phase growth. With an increase in amount of boron in the above case, the carrier (hole) concentration increases. The second amorphous layer preferably has a carrier concentration of $5 \times 10^{18}$ cm$^{-3}$ to $1 \times 10^{20}$ cm$^{-3}$. In accordance with the carrier concentration, the acceptor concentration at room temperature is preferably $2 \times 10^{19}$ cm$^{-3}$ to $4 \times 10^{20}$ cm$^{-3}$. When the hole concentration of the second amorphous layer falls below the aforementioned range, caused by electrical compensation of an acceptor component by a donor component present in an excessive amount, the second amorphous layer generally exhibits high resistance. Specifically, such an amorphous layer encounters difficulty in production of an LED providing a low forward voltage (Vf). In contrast to this, when the hole concentration is higher than the aforementioned range, an acceptor component contained in an excessive amount in the second amorphous layer diffuses and migrates into the light-emitting layer, to thereby electrically compensate for n-type carriers (electrons) contained in the light-emitting layer. In this case, the resistance of the light-emitting layer increases, which is disadvantageous.

Each of the first and the second amorphous layers is preferably formed of an undoped boron phosphide layer without intentionally doping with an impurity (i.e., without doping). The reason for employing the above process is to prevent variation in resistance of the light-emitting layer caused by diffusion of the impurity present in the amorphous layers to the light-emitting layer occurring during vapor phase growth of the amorphous boron phosphide layers. The second amorphous layer, which serves as an underlying layer on which a p-type polycrystalline boron phosphide conductive layer serving as a p-type upper cladding layer is formed, preferably has a thickness of 2 nm to 450 nm. When the layer is extremely thin; i.e., has a thickness less than 2 nm, the surface of the first amorphous layer is not completely, sufficiently, and homogeneously covered, thereby failing to produce a p-type upper cladding layer having excellent in-plane homogeneity in terms of thickness and carrier concentration. A thickness, of the boron-rich amorphous layer, in excess of 450 nm is disadvantageous for attaining a flat surface of the amorphous layer.

The suitable layer formation temperature of the first amorphous layer differs from that of the second amorphous layer, because the two layers serve different functions. Hereinafter, the formation steps for each layer will be described in detail.

The first amorphous layer is formed directly on the surface of the underlying crystal in order to relax the lattice mismatch between the underlying crystal and the p-type boron phosphide crystal layer. Through provision of such a layer, a p-type boron phosphide crystal layer free from misfit dislocations with excellent adhesion to the underlying crystal can be formed.

The first amorphous layer having the above function can be formed through vapor phase growth by feeding a boron-containing compound (boron source) and a phosphorus-containing compound (phosphorus source) to a vapor phase growth zone at a temperature higher than 250° C. and lower than 750° C. In order to form the first amorphous layer through the vapor phase growth method at a temperature higher than 250° C. and lower than 750° C., the underlying crystal is placed in a vapor phase growth zone and the underlying crystal is heated to a temperature higher than 250° C. and lower than 750° C. for vapor phase growth. Notably, when the layer formation temperature (temperature of underlying crystal) is 250° C. or lower, thermal decomposition of a boron source and a phosphorus source does not proceed sufficiently, possibly failing to form a layer containing boron and phosphorus, whereas when the layer formation temperature is 750° C. or higher, the formed layer has a polycrystalline or single-crystal structure, possibly failing to form an amorphous layer.

The first amorphous layer can be effectively formed when the V/III ratio is controlled to a low level during vapor phase growth. Specifically, in order to successfully form the first amorphous layer at the aforementioned layer formation temperature, the V/III ratio is preferably controlled to 0.2 to 50, more preferably 2 to 50. For example, when layer formation is performed through a halogen vapor phase growth method, and boron tribromide (chemical formula: $BBr_3$) and phosphorus trichloride (chemical formula: $PCl_3$) are used as sources, the V/III ratio is preferably controlled to about 10. When a V/III ratio is too low, a layer containing aggregated spherical shape boron crystals and having poor surface flatness may be formed, possibly resulting in poor surface flatness of the p-type boron phosphide crystal layer to be formed in a subsequent step, whereas when the V/III ratio is elevated to higher than 50, a polycrystalline layer may be formed, thereby possibly failing to successfully form the first amorphous layer.

In the present invention, the first amorphous layer containing boron atoms and phosphorus atoms is preferably a p-type conductive layer which is stoichiometrically rich in boron atoms. The reason is as follows. As described hereinafter, the second amorphous layer is preferably a p-type conductive layer, so that a p-type boron phosphide crystal layer is successfully formed. The second amorphous layer is grown while inheriting the nature of the first amorphous layer. Therefore, in order to yield the second amorphous layer serving as a p-type conductive layer, the first amorphous is preferably a p-type conductive layer.

The first amorphous layer preferably has a thickness of 2 nm to 50 nm. When the thickness of the first amorphous layer is less than 2 nm, the surface of the underlying crystal to be covered might fail to be coated with the amorphous layer sufficiently and uniformly. As a result, deformation due to a difference in thermal expansion coefficient or other factors is not uniformly relaxed, possibly causing peeling off of the p-type boron phosphide crystal layer from the underlying crystal. Meanwhile, the surface of the underlying crystal can be uniformly coated with the first amorphous layer, leading to resolution of the above problem, provided that the first amorphous layer has a thickness of 2 nm or more. In addition to this, the first amorphous layer functions as a surface-protection layer for preventing thermal decomposition of the underlying crystal during the formation of the first amorphous layer. This function is successfully attained by increasing the layer thickness to 2 nm or more. This is critical, particularly when a Group III nitride semiconductor or a similar material, which is prone to thermally decompose due to vaporization of the Group V element or other factors, is employed as an underlying crystal or when the first amorphous layer is formed at a high layer formation temperature. Needless to say, with increasing thickness of the first amorphous layer; i.e., a surface-protection layer for the underlying crystal, the function thereof is more effectively attained. A layer thickness in excess of 50 nm is not preferred, because single-crystal grains may be formed in the first amorphous layer, or a polycrystalline layer may be formed.

The second amorphous layer functions as an underlying layer for depositing a p-type boron phosphide crystal layer. Through provision of the second amorphous layer, the p-type boron phosphide crystal layer can be formed successfully and readily. In addition, the second amorphous layer functions as a protection layer for preventing thermal decomposition of the first amorphous layer during vapor phase growth of the second amorphous layer.

Similar to the case of the first amorphous layer, the second amorphous layer can be formed through vapor phase growth by feeding a boron-containing compound (boron source) and a phosphorus-containing compound (phosphorus source) to a vapor phase growth zone. The vapor phase growth method for forming the second amorphous layer may be the same vapor phase growth method as employed in formation of the first amorphous layer or a method different from the above method. From the viewpoint of production efficiency or other factors, the former method is preferred. The latter method may be performed by growing a first amorphous layer through the hydride method employing a diborane $(B_2H_6)$/phosphine $(PH_3)$/hydrogen $(H_2)$ system and forming a second amorphous layer through MOCVD. Any appropriate combination of methods may be employed.

In the present invention, the second amorphous layer containing boron atoms and phosphorus atoms preferably has a composition stoichiometrically rich in boron atoms. Through provision of the second amorphous layer, a p-type boron phosphide crystal layer can be successfully formed thereon. The equivalent stoichiometric composition of boron phosphide accounts for a ratio of 1:1 (boron atoms:phosphorus atoms). When a boron-rich second amorphous layer is formed from boron phosphide, layer formation is preferably performed such that the number of boron atoms exceeds about 0.5 to 1.0% the number of phosphorus atoms.

The layer formation temperature at which the second amorphous layer is formed is preferably 1,000° C. to 1,200° C. When such a layer formation temperature is employed, a second amorphous layer stoichiometrically rich in boron can be successfully formed. Since the underlying crystal surface has already been coated with the first amorphous layer which functions as a surface-protection layer, thermal decomposition of the underlying crystal is prevented even when the second amorphous layer is formed at a temperature of 1,000° C. or higher.

Similar to the case of the first amorphous layer, the V/III ratio at which the second amorphous layer is formed preferably falls within a range of 2 to 50. As the preferred layer formation temperature for the second amorphous layer is higher than that for the first amorphous layer, the second amorphous layer is preferably formed at a V/III ratio greater than that employed in formation of the first amorphous layer. To perform layer formation at a V/III ratio greater than that employed in the formation of the first amorphous layer, one possible method is that the amount of the phosphorus source (Group V source) is increased while the amount of the boron source (Group III source) to be fed to a vapor phase growth zone is maintained at a level similar to that employed in formation of the first amorphous layer. The second amorphous layer is formed at the thus-increased V/III ratio. Upon formation of the second amorphous layer, controlling of the V/III ratio to a high level within the aforementioned range is preferred, because an excellent surface flatness of the formed second amorphous layer can be attained. In addition, vaporization of elements such as boron and phosphorus contained in the first amorphous layer during vapor phase growth of the second amorphous layer can also be prevented, provided that the V/III ratio is controlled to a higher level.

Similar to the case of the first amorphous layer, the second amorphous layer preferably has a thickness of 2 nm to 50 nm. Particularly when a pn-junction structure of a compound semiconductor light-emitting device having a pn-junction-type light-emitting portion is fabricated with an n-type Group III nitride semiconductor as an underlying crystal, the total thickness of the first and the second amorphous layers is preferably controlled to 100 nm or less. The reason for controlling the total thickness is as follows. Because at least the second amorphous layer of the first and the second amorphous layers has a composition which is stoichiometrically rich in boron, flow resistance of device operation current to a light-emitting portion provided by the presence of the first and the second amorphous layers is reduced to a certain extent. If the first and the second amorphous layers are, for example, p-type layers of π-type and the total layer thickness is in excess of 100 nm, flow resistance of device operation current to the light-emitting portion provided by the presence of the first and the second amorphous layers increases.

A p-type upper cladding layer formed of p-type boron phosphide is provided on the second amorphous layer. The upper cladding layer can be formed through the aforementioned vapor phase growth method for forming the first and the second amorphous layers. The p-type boron phosphide layer serving as the upper cladding layer is preferably formed of a low-resistance conductive layer having a low resistivity in order to form a p-type electrode having excellent Ohmic characteristics. An undoped polycrystalline p-type boron phosphide having a resistivity at room temperature of 0.1 Ω·cm or less is particularly preferred for forming the p-type boron phosphide layer. The upper cladding layer formed of a p-type conductive layer having such a low resistance can be employed as a contact layer for forming a p-type Ohmic electrode. The p-type upper cladding layer having a resistivity of 0.1 Ω·cm or less is essentially formed on an underlying layer; i.e., the second amorphous boron phosphide layer having an acceptor concentration at room temperature of $2\times10^{19}$ cm$^{-3}$ to $4\times10^{20}$ cm$^{-3}$ and a carrier concentration at room temperature of $5\times10^{18}$ cm$^{-3}$ to $1\times10^{20}$ cm$^{-3}$. The polycrystalline layer serving as the p-type upper cladding layer is grown while inheriting the p-type conductivity of the amorphous boron phosphide layer serving as the underlying layer.

The stoichiometric conditions of the second amorphous layer; i.e., rich in boron and deficient in phosphorus, themselves, are transferred to the polycrystalline boron phosphide layer serving as the upper cladding layer. Therefore, electrical properties of the second amorphous layer, themselves, are transferred to the upper cladding layer, whereby the upper cladding layer assumes the form of a p-type conductive polycrystalline layer. When the aforementioned low-resistivity p-type boron phosphide serving as the p-type conductive layer is formed at the same V/III ratio as employed for forming the second amorphous layer, the p-type boron phosphide is advantageously formed at a temperature not lower than the second amorphous layer formation temperature and not higher than 1,200° C. In addition, decreasing the V/III ratio (also employed for forming the second amorphous layer) to a low level falling within the aforementioned preferred range is advantageous for obtaining the p-type polycrystalline layer having a low resistivity in an as grown state. The polycrystalline p-type boron phosphide layer serving as the upper cladding layer preferably has a carrier concentration at room temperature of $5\times10^{18}$ cm$^{-3}$ to $1\times10^{20}$ cm$^{-3}$. When the carrier concentration is lower than $5\times10^{18}$ cm$^{-3}$, a low-resistance p-type conductive layer having a resistivity of 0.1 Ω·cm or less cannot be formed, although the mobility at room temperature is enhanced, whereas when the carrier concentration is higher than $1\times10^{20}$ cm$^{-3}$, absorption of the light emitted from the light-emitting layer increases, which is not preferred for producing an LED of high emission intensity. Furthermore, the p-type boron phosphide layer preferably has an acceptor concentration at room temperature of $2\times10^{19}$ cm$^{-3}$ to $4\times10^{20}$ cm$^{-3}$. A large acceptor concentration in excess of $4\times10^{20}$ cm$^{-3}$ is not preferred, because a polycrystalline boron phosphide layer having a surface lacking in flatness is formed, which is detrimental to provision of an Ohmic electrode mentioned hereinafter.

In a p-side-up light-emitting device, in which the light emitted from a light-emitting layer such as an LED or an surface emission LD is taken to the outside in a vertically upward direction, the p-type upper cladding layer is essentially formed of undoped polycrystalline p-type boron phosphide, which can transmit the light emitted from the light-emitting layer to the outside at high efficiency. The performance of transmission of emitted light to the outside (represented by transmittance) decreases exponentially with increasing thickness of the p-type upper cladding layer. Thus, when the maximum layer thickness of the p-type upper cladding layer, having the aforementioned preferred carrier concentration, is controlled to $5\times10^{-4}$ cm (=5 μm) or less, the p-type upper cladding layer having excellent transmittance can be formed. When the p-type upper cladding layer is formed from a polycrystalline layer, strain attributed to lattice mismatch with the light-emitting layer material is effectively absorbed. As a result, strain to be provided to the light-emitting layer can be reduced, despite use of a thick polycrystalline layer. Therefore, unstable fluctuation in wavelength of the light emitted from the light-emitting layer, the fluctuation being caused by strain provided to the layer, can be effectively prevented. On the other hand, the p-type upper cladding layer included in a plane-type LED is required to supply forward current for driving the device to a wide area of the light-emitting layer formed thereunder. In this case, the upper cladding layer preferably has a thickness of 50 nm or more.

For example, when the upper cladding layer is formed from a polycrystalline p-type boron phosphide layer having a thickness of 1 μm and a carrier concentration of $2\times10^{19}$ cm$^{-3}$, the layer also serves as a window layer having a transmittance higher than 40% with respect to blue light (wavelength: 450 nm). A p-type upper cladding layer having a higher transmittance can be formed from a polycrystalline p-type boron phosphide layer which maintains a resistivity at 0.1 Ω·cm or lower and has a lower carrier concentration and a smaller thickness. In p-side-up nitride semiconductor LEDs, a p-type Group III nitride semiconductor layer serving as the upper cladding layer has a high resistivity, thereby failing to satisfactorily diffuse forward current, over the entirety of the light-emitting layer, uniformly. For solving the problem, in a conventional Group III nitride semiconductor LED, a transparent electrode formed of, for example, nickel (symbol of element: Ni) is generally provided for uniformly diffusing the forward current on a p-type cladding layer. However, the transmittance of emitted light remains less than 40%, because such a metallic or metal oxide film absorbs emitted light. According to the advantageous structure of the present invention, a p-type upper cladding layer having excellent transmittance of emitted light can be provided without intentionally providing a transparent electrode for diffusing the forward current, and a light-emitting device can be readily provided.

By the mediation of an amorphous layer formed of a boron phosphide-based semiconductor, a p-type upper cladding layer formed of a low-resistance p-type boron phosphide-based semiconductor can be formed. In addition, a p-type upper cladding layer formed of a p-type boron phosphide-based semiconductor of high quality having a small dislocation density can be effectively formed. In a light-emitting layer formed on a crystalline substrate having a poor lattice matching degree, dislocations penetrating the light-emitting layer are generally present at a density higher than about $10^{10}$ cm$^{-2}$. The amorphous layer according to the present invention formed of a boron phosphide-based semiconductor and provided so as to attain joining to the light-emitting layer can inhibit transfer of such high-density dislocations into the p-type upper cladding layer formed of a p-type boron phosphide-based semiconductor at the junction interface between the amorphous layer and the light-emitting layer. Thus, by the mediation of the amorphous layer formed of a boron phosphide-based semiconductor, a p-type upper cladding layer formed of a low-resistive p-type boron phosphide-based semiconductor exhibiting p-type conduction and having excellent crystallinity with a dislocation density of $1 \times 10^3$ cm$^{-3}$ or less can be provided in an as-grown state. Such a low-resistive p-type boron phosphide-based semiconductor layer having a low dislocation density can be advantageously employed for forming a p-type cladding layer which can prevent breakdown voltage failure caused by local leakage of device operation current occurring via dislocations.

The temperature at which the p-type upper cladding layer formed of a p-type boron phosphide-based semiconductor is formed preferably falls within a range of 1,000° C. to 1,200° C. A layer formation temperature higher than 1,200° C. is not preferred, because a polyboron species such as $B_{13}P_2$ may be formed.

In this step, the V/III ratio is preferably controlled to a greatly higher level than that employed in vapor phase growth for forming the first or the second amorphous layer, specifically 600 to 2,000.

A p-type boron phosphide crystal layer can be formed on the stoichiometrically boron-rich second amorphous layer without intentionally adding an impurity for attaining p-type conduction (p-type dopant) (i.e., without doping). Specifically, a low-resistive p-type boron phosphide crystal layer having a carrier (hole) concentration of about $2 \times 10^{19}$ cm$^{-3}$ and a resistivity of about $5 \times 10^{-2}$ Ω·cm can be formed without doping through MOCVD at 1,025° C. by use of a triethylborane ($(C_2H_5)_3B$)/phosphine ($PH_3$)/hydrogen ($H_2$) system.

As described above, the present invention has an advantage in that a p-type boron phosphide crystal layer can be readily formed without doping. Alternatively, the p-type boron phosphide crystal layer may also be formed by adding a p-type impurity such as silicon (Si). Because the silicon impurity serves as a remarkably effective p-type impurity when contained in a boron phosphide crystal layer which is rich in boron with respect to phosphorus, a low-resistance boron phosphide crystal layer is formed by doping boron phosphide with silicon. Examples of silicon dopant sources include silane (molecular formula: $SiH_4$), disilane (molecular formula: $Si_2H_6$), and halosilicon compounds such as silicon tetrachloride (molecular formula: $SiCl_4$). A mixed gas such as $Si_2H_6$-$H_2$ can also be used.

Notably, the silicon impurity serves as an n-type impurity, when contained in a phosphorus-rich boron phosphide crystal layer, and electrically compensates for acceptors. Therefore, doping of a phosphorus-rich boron phosphide layer with silicon provides a reverse effect, thereby forming a high-resistant boron phosphide layer.

A p-type electrode is provided on the surface of the p-type upper cladding layer. The p-type electrode is preferably fabricated from a bottom-side electrode and a p-type Ohmic electrode. The bottom-side electrode is in contact with the surface of the p-type upper cladding layer.

As the p-type upper cladding layer has been already endowed with a low resistance in an as-grown state, the device operation current is provided restrictively to a light-emitting layer which is a portion directly below the upper cladding layer. In order to avoid short-circuit-like flow of device operation current, the bottom-side electrode, provided on the surface of the upper cladding layer so as to attain contact with the layer, is formed of a non-Ohmic material not forming an Ohmic contact with the p-type boron phosphide-based semiconductor serving as the upper cladding layer. Examples of preferred materials for forming the bottom-side electrode included in the p-type electrode include alloys containing a Group IV element such as a gold-tin (Au-Sn) alloy and a gold-silicon (Au—Si) alloy. Tin (Sn) has an atomic radius greater than that of boron (B) and phosphorus (P) forming boron phosphide. Therefore, thermal diffusion into the p-type upper cladding layer formed of a p-type boron phosphide-based semiconductor layer, which may otherwise occur uselessly, can be prevented upon alloying or a similar process, thereby effectively maintaining excellent crystallinity of the p-type upper cladding layer formed of a p-type boron phosphide-based semiconductor layer.

Since gold-silicon (Au—Si) alloy contains an element Si, which is more difficult to diffuse in the boron phosphide-based semiconductor, there can be effectively prevented an increase in the degree of disorder of the p-type boron phosphide-based semiconductor crystalline layer caused by thermal diffusion of silicon. However, film formation of gold-silicon alloy by means of, for example, vapor phase deposition means requires higher temperature as compared with gold-tin alloy. Therefore, gold-tin alloy is more preferred for forming a bottom-side electrode which can more effectively prevent thermal deterioration of the p-type boron phosphide-based semiconductor layer, particularly the light-emitting layer. For the purpose of preventing an increase in the degree of disorder of crystal conditions of the p-type boron phosphide-based semiconductor crystalline layer, particularly those of the light-emitting layer, caused by thermal diffusion of elements, the bottom-side electrode is preferably formed of gold-silicon alloy film. Regardless of which of the two alloy films is used, the bottom electrode included in the p-type electrode can be formed of a non-Ohmic material, thereby preventing short-circuit-like flow of the device operational current via the low-resistance p-type upper cladding layer to a portion of the light-emitting layer directly below the upper cladding layer.

Examples of a material forming the bottom-side electrode include transition metals such as nickel (Ni), titanium (Ti), and vanadium (V). Among them, titanium (Ti) is particularly preferably used for forming a bottom-side electrode, since Ti provides strong adhesion and a high Schottky barrier height to the p-type boron phosphide layer serving as the p-type upper cladding layer.

When the Ohmic electrode formed of a material able to form an Ohmic contact with p-type boron phosphide-based semiconductor is provided so as to attain electric contact with the bottom-side electrode, the device operation current, of which flow is inhibited by the bottom-side electrode, can effectively be diffused over a wide area of the p-type upper cladding layer.

In an LED from which emitted light is extracted via the p-type cladding layer to outside, the light emitted from a portion of the light-emitting layer corresponding to the projection area of the p-type electrode is difficult to effectively extract to the outside, because the portion is covered with the p-type electrode. However, when an Ohmic electrode formed of a material able to form an Ohmic contact with the p-type upper cladding layer is formed on the bottom-side electrode, flow of the device operational current can be provided over a wide area of the light-emitting layer other than the projection area of the p-type electrode. The electrode attaining Ohmic contact with the p-type boron phosphide-based semiconductor can be formed of, for example, an alloy containing a Group II element such as a gold-beryllium (Au—Be) alloy or a gold-zinc (Au—Zn) alloy. In particular, a gold-beryllium alloy is capable of forming an Ohmic electrode which has excellent adhesion to the bottom-side electrode and low contact resistance. Such a p-type electrode including a bottom-side electrode formed of a non-Ohmic material covered with an Ohmic material allows the device operational current to flow in an uncovered portion of the light emission area other than the projection area of the p-type electrode; i.e., in a portion of the light emission area exposed to the outside, the flow of the device operational current being inhibited by the bottom-side electrode formed of a non-Ohmic material having a high contact resistance with respect to the p-type boron phosphide-based semiconductor. In order to provide the device operation current homogeneously over a wide area of the portion of the light emission area exposed to the outside, the p-type Ohmic electrode is desirably disposed in terms of shape and intervals such that uniform electric potential distribution is provided in a portion of the light emission area open to the outside. Such means for disposing the p-type Ohmic electrode can provide a high-emission-intensity LED which emits light from the light emission area with homogeneous intensity.

The Ohmic electrode is preferably provided so as to extend on a surface area of the p-type upper cladding layer other than the bottom-side electrode-provided area and to attain contact with the surface area. For example, the Ohmic electrode is formed of a stripe electrode extending on the plane of the light-emitting device symmetrically with respect to the center. Alternatively, the Ohmic electrode may be formed of a ring-shape electrode which is concentric with the center of the plane and in electric contact with each other. These materials can be processed to an Ohmic electrode of a desired shape through patterning or selective etching based on a known photolithographic method.

The Schottky contact (non-Ohmic contact) function of the aforementioned bottom-side electrode can be maintained by providing an intermediate layer formed of a transition metal or platinum (Pt) between the bottom-side electrode and the Ohmic electrode. The intermediate layer formed of a transition metal prevents diffusing or migration of material components forming the Ohmic electrode to the bottom-side electrode, thereby maintaining the function of the bottom-side Schottky contact electrode. The intermediate layer is preferably formed of molybdenum (Mo), nickel (Ni), or platinum (Pt), which element can most effectively prevent intermetallic diffusion of electrode-forming components between the bottom-side electrode and the Ohmic electrode. The transition metal intermediate layer suitably has a thickness of 5 nm to 200 nm. When the intermediate layer has a thickness as small as less than 5 nm, intermetallic diffusion of the electrode components cannot be prevented to a satisfactory degree, and the bottom-side electrode may become a non-Schottky contact electrode; e.g., an Ohmic contact electrode. When the intermediate layer has a thickness in excess of 200 nm, the distance between the Ohmic electrode and the p-type upper cladding layer, which are in contact with the intermediate layer, increases. Thus, space between the Ohmic electrode and the p-type upper cladding layer may be provided around the bottom side electrode, thereby disadvantageously increasing the input resistance to the device operation current.

In a boron phosphide-based semiconductor light-emitting device including a light-emitting layer formed of an n-type Group III nitride semiconductor; an upper cladding layer which is provided on the light-emitting layer and which is formed of a p-type boron phosphide-based semiconductor; and a p-type Ohmic electrode formed so as to attain contact with the p-type upper cladding layer, a boron phosphide-based semiconductor amorphous layer that is provided so as to attain contact with the light-emitting layer formed of an n-type Group III nitride semiconductor prevents thermal deterioration of a light-emitting layer.

The boron phosphide-based semiconductor amorphous layer that is provided so as to attain contact with the light-emitting layer formed of an n-type Group III nitride semiconductor prevents propagation of dislocations from the light-emitting layer to the upper layer.

A second amorphous layer which is formed of a boron phosphide-based semiconductor vapor-phase grown at a temperature higher than the temperature at which the aforementioned first amorphous layer serves as an underlying layer for providing a low-resistance upper cladding layer formed of a p-type boron phosphide-based semiconductor in an as-grown state.

In a p-type electrode provided on the p-type upper cladding layer formed of a p-type boron phosphide-based semiconductor, a bottom-side electrode formed of a material able to form non-Ohmic contact with a p-type boron phosphide-based semiconductor forming the p-type upper cladding layer serves as a resistor upon passage of device operation current and prevents short-circuit-like flow of the device operation current to an area of the light-emitting layer corresponding to the projection area of the p-type electrode, from which the emitted light is difficult to extract to the outside.

A p-type Ohmic electrode which constitutes the p-type electrode with the aforementioned bottom-side electrode and which is in Ohmic contact with the p-type boron phosphide-based semiconductor causes the device operation current to preferentially flow to the open-to-the-outside portion of the light-emitting area.

The first amorphous layer formed of a boron phosphide-based semiconductor serves as an underlying layer for providing "adsorption sites" for promoting vapor phase growth of the second amorphous layer, when the second amorphous layer formed of a boron phosphide-based semiconductor is provided so as to attain joining to the first amorphous layer. For example, the first amorphous layer provides a second amorphous layer which provides excellent adhesion to the light-emitting layer. The first and the second amorphous layers formed of an undoped boron phosphide-based semiconductor prevent, for example, inversion of the conduction type of the light-emitting layer caused by diffusion and migration of impurities.

The second amorphous layer which is stoichiometrically rich in boron with respect to phosphorus imparts the non-stoichiometric composition to the polycrystalline boron phosphide layer serving as the upper cladding layer, thereby causing the polycrystalline boron phosphide layer to be suitable for providing the p-type upper cladding layer.

The p-type electrode, which is provided on the p-type upper cladding layer formed of a boron phosphide-based semiconductor so as to attain contact with the cladding layer and which includes a bottom-side electrode formed of a non-Ohmic contact material, prevents flow of device operation current to a region directly below the electrode and supplies the device operation current preferentially to the light-emitting layer such that emitted light can be readily extracted to the outside. In particular, the Ohmic electrode in electrical contact with the surface of the p-type upper cladding layer and extending so as to achieve contact also with the surface of the upper cladding layer diffuses the device operation current, via the p-type upper cladding layer, over a wide area of the light-emitting layer.

EXAMPLE 1

Figure 2:
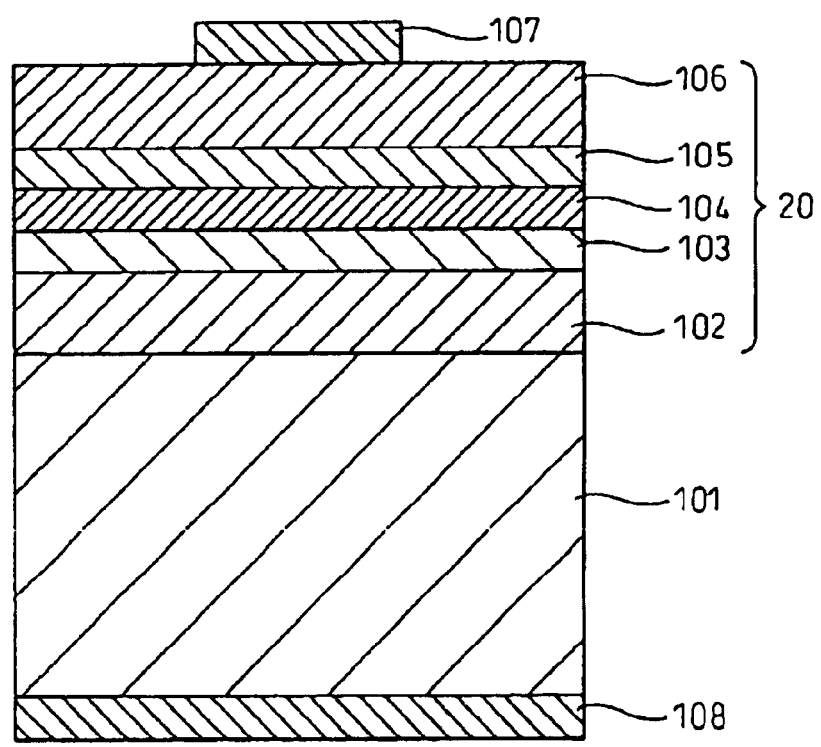
FIG. 2 is a schematic cross-sectional view of an LED described in Example 1.

A double-hetero-junction light-emitting diode (LED) having a pn-junction structure including an upper cladding layer formed of p-type boron phosphide and a light-emitting layer formed of n-type gallium nitride was produced as an exemplary boron phosphide-based semiconductor light-emitting device. FIG. 2 schematically shows a cross-section of the produced LED.

A phosphorus (P)-doped n-type silicon {111} single crystal was used as a single-crystal substrate 101. Firstly, on the {111} surface of the single-crystal substrate 101, a lower cladding layer 102 formed of an undoped n-type boron phosphide layer was vapor-phase grown through atmospheric-pressure (near atmospheric pressure) MOCVD at 925° C. by use of a triethylborane (($C_2H_5)_3$B)/phosphine ($PH_3$)/hydrogen ($H_2$) system. The n-type boron phosphide layer serving as the lower cladding layer 102 was formed at a concentration ratio regarding sources fed to a vapor phase growth zone; i.e., a V/III ratio (=$PH_3$/($C_2H_5)_3$B ratio) of about $1.3×10^3$. The thickness of the layer and the carrier concentration were controlled to 300 nm and $1×10^{19}$ cm$^{-3}$, respectively. The thus-formed lower cladding layer 102 was found to have a forbidden band gap of about 3 eV at room temperature.

Subsequently, on the lower cladding layer 102, a light-emitting layer 103 having a thickness of 10 nm was formed through atmospheric-pressure (near atmospheric pressure) MOCVD at 850° C. by use of a trimethylgallium (($CH_3)_3$Ga)/ammonia ($NH_3$)/hydrogen ($H_2$) system. The light-emitting layer 103 had a multi-phase structure which was formed from a plurality of n-type gallium indium nitride crystalline phases ($Ga_xIn_{1-x}N$) having indium (In) composition (1-x) that differ from one another. The formed light-emitting layer 103 was found to have an average indium composition (1-x) of 0.12 (12%) as determined on the basis of elemental quantitative analysis by means of a transmission electron microscope (TEM).

Feeding of trimethylgallium into the vapor phase growth zone was stopped so as to complete vapor phase growth of the light-emitting layer 103. Thereafter, the temperature of the single-crystal substrate 101 was lowered to 450° C. in an atmosphere containing ammonia ($NH_3$) and hydrogen. Subsequently, on the light-emitting layer 103, a first amorphous layer 104 formed of an undoped boron phosphide layer was formed through atmospheric-pressure MOCVD at 450° C. by use of a ($C_2H_5)_3$B/$PH_3$/$H_2$ system. The first amorphous layer 104 was vapor-phase grown at a V/III ratio (=$PH_3$/($C_2H_5)_3$B) of 10 so as to cause the layer to be stoichiometrically rich in boron. The thickness of the layer was controlled to 15 nm.

Feeding of ($C_2H_5)_3$B into the vapor phase growth zone was stopped so as to complete vapor phase growth of the first amorphous layer 104. Thereafter, the temperature of the single-crystal substrate 101 was elevated to 1,025° C. in the vapor phase growth zone where a flow of $PH_3$ and $H_2$ was maintained.

Subsequently, on the first amorphous layer 104, a second amorphous layer 105 constituted by an undoped boron phosphide layer was formed through atmospheric-pressure MOCVD at 1,025° C. by use of a ($C_2H_5)_3$B/$PH_3$/$H_2$ system. The second amorphous layer 105 was vapor-phase grown at a V/III ratio of 15 so as to form a p-type-conductive layer stoichiometrically rich in boron with respect to phosphorus. The thickness of the layer was controlled to 10 nm.

After completion of vapor phase growth of the second amorphous layer 105, the amount of $PH_3$ fed to the vapor phase growth zone was selectively elevated such that the V/III ratio was controlled to 1,290, while the amount of ($C_2H_5)_3$B fed remained constant. Subsequently, on the second amorphous layer 105, an upper cladding layer 106 constituted by an undoped p-type boron phosphide crystal layer was formed through atmospheric-pressure MOCVD at 1,025° C. by use of a ($C_2H_5)_3$B/$PH_3$/$H_2$ system. The thickness of the upper cladding layer 106 was controlled to 600 nm. The thus-formed upper cladding layer 106 became stoichiometrically rich in boron, because the vapor phase growth was carried out at a temperature higher than 1,000° C. and at a low V/III ratio as described above. The layer was found to have a carrier concentration of $2×10^{19}$ cm$^{-3}$ and a resistivity of $5×10^{-2}$ Ω·cm, as measured through conventional Hall effect measurement performed at room temperature. Thus, a low-resistive upper cladding layer (p-type boron phosphide crystal layer) was produced.

Feeding of ($C_2H_5)_3$B into the vapor phase growth zone was stopped so as to complete vapor phase growth of the upper cladding layer 106. Thereafter, the temperature of the single-crystal substrate 101 was lowered to about 600° C. while the substrate was placed under the flow of a mixture of $PH_3$ and $H_2$.

As described above, the lower cladding layer 102, the light-emitting layer 103, the first amorphous layer 104, the second amorphous layer 105, and the upper cladding layer 106 formed of the p-type boron phosphide crystal layer were sequentially stacked on the single-crystal substrate 101, to thereby form a stacked structure 20.

Analysis of the thus-produced stacked structure 20 revealed that selected-area pattern electron diffraction images patterns of the first and second amorphous layers 104 and 105 exhibit halo diffraction patterns, confirming that these layers were amorphous. In contrast, the selected-area diffraction pattern of the upper cladding layer 106 was found to exhibit a pattern attributable to a {111}-crystal layer, indicating that the upper cladding layer was formed of a p-type boron phosphide crystal layer.

In a bright-field TEM image of the upper cladding layer 106 formed of a p-type boron phosphide crystal layer, substantially no misfit dislocation was visually observed, although presence of twins or stacking faults was identified in a direction parallel to the <111>-crystal direction.

In addition, the ratio of intensity of boron (B) ion to that of phosphorus (P) ion as determined in field-emission AES analysis revealed that the boron atom concentration of the first and the second amorphous layers 104 and 105 and the upper cladding layer 106 formed of a p-type boron phosphide crystal layer was about 0.5% excess with respect to the phosphorus atom concentration.

Next, the single-crystal substrate 101 on which the stacked structure 20 had been formed was cooled to about room temperature and was removed from the vapor phase growth zone. Subsequently, a p-type Ohmic electrode 107 with a circular shape and formed of gold-beryllium (Au 99% by weight, Be 1% by weight) alloy was placed generally on a center of the surface of the stacked structure 20; i.e., the upper cladding layer 106 formed of the p-type boron phosphide crystal layer. On the entire backside of the single-crystal substrate 101, an n-type Ohmic electrode 108 formed of aluminum-antimony (Al—Sb) alloy was formed. Thus, a pn-junction DH structure LED with a square shape having a side length of approximately 300 μm was produced.

Upon flow of forward current of 20 mA between the p-type and the n-type Ohmic electrodes 107 and 108, the following emission characteristics of the LED were obtained.

(1) Color of emitted light: bluish purple
(2) Center emission wavelength: about 440 nm
(3) Luminous intensity (as chip): about 6 mcd
(4) Forward voltage: about 3.5 V The reverse voltage upon passage of reverse current of 10 μA between the p-type and n-type Ohmic electrodes 107 and 108 was found to be 10 V.

In addition, a near field light emission pattern of the LED confirmed that the light emission was provided from generally the whole surface of the light-emitting layer 103. The reason for provision of such light emission is considered as follows. In the Example, the upper cladding layer 106 was formed of a low-resistive p-type boron phosphide crystal layer. Therefore, operation current could diffuse, via the upper cladding layer 106, into a wide area of the light-emitting layer 103. In addition, in the Example, the upper cladding layer 106 formed of a p-type boron phosphide crystal layer was formed on the light-emitting layer formed of a Group III nitride semiconductor (gallium indium nitride), with the first and the second amorphous layers 104 and 105 intervening between the crystal layer and the light emitting layer. Therefore, an LED showing excellent rectifying characteristics; i.e., causing few local breakdowns, was provided.

EXAMPLE 2

The boron phosphide-based compound semiconductor device according to the present invention will next be described in detail, taking as an example a light-emitting diode (LED) employing a boron phosphide (BP) amorphous layer, which is a typical boron phosphide-based semiconductor.

Figure 3:
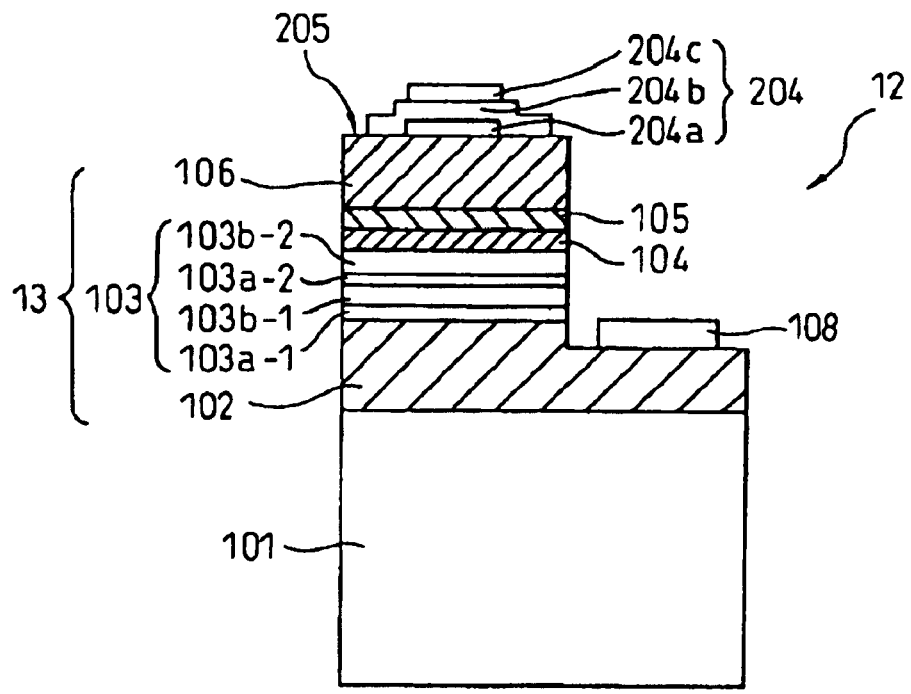
FIG. 3 is a schematic cross-sectional view of an LED described in Example 2.
Figure 4:
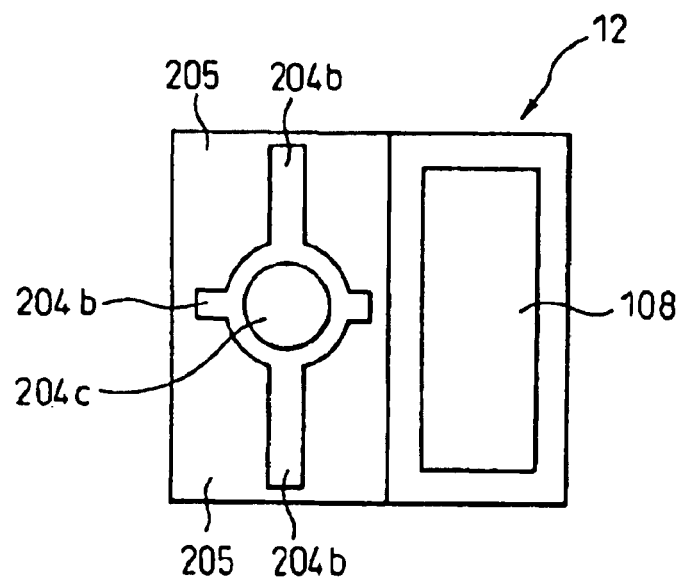
FIG. 4 is a schematic plane view of the LED shown in FIG. 3.

FIG. 3 schematically shows the cross-section of a stacked structure 13 employed for fabricating an LED 12 having a pn-junction type double-hetero (DH) structure. FIG. 4 is a schematic plane view of the LED shown in FIG. 3.

A (0001)-sapphire (α-Al$_2$O$_3$ single crystal) was used as a single-crystal substrate 101. On the (0001)-surface of the single-crystal substrate 101, a lower cladding layer 102 formed of n-type gallium nitride (GaN) was deposited through atmospheric pressure (near atmospheric pressure) metal-organic vapor phase epitaxy (MOVPE) means. The lower cladding layer 102 was deposited at 1,050° C. by use of a trimethylgallium (molecular formula: (CH$_3$)$_3$Ga) as a gallium (Ga) source and ammonia (molecular formula: NH$_3$) as a nitrogen source. The carrier concentration of the n-type GaN layer serving as the lower cladding layer 102 was controlled to $4 \times 10^{18}$ cm$^{-3}$ through doping with silicon (Si), and the thickness was controlled to 2,800 nm. Feeding of the aforementioned gallium source was stopped so as to complete growth of the lower cladding layer 102. Thereafter, the temperature of the single-crystal substrate 101 was lowered to 750° C. in an atmosphere containing a nitrogen source (=NH$_3$) and hydrogen.

Subsequently, on the n-type lower cladding layer 102, a well layer 103a-1 formed of n-type gallium indium nitride (Ga$_{0.90}$In$_{0.10}$N) was formed by use of trimethylindium (molecular formula: (CH$_3$)$_3$In) as an indium (In) source and the aforementioned gallium source. The gallium indium nitride layer serving as the well layer 103a-1 had a multi-phase structure which was formed from a plurality of phases having indium compositional proportions that differ from one another. The average composition of indium was found to be 0.10 (=10%). The thickness of the well layer 103a-1 was controlled to 10 nm. On the well layer 103a-1, a barrier layer 103b-1 formed of n-type gallium nitride (GaN) was provided through the aforementioned atmospheric pressure MOCVD means at 750° C. by use of (CH$_3$)$_3$Ga)/NH$_3$/H$_2$ reaction system so as to attain joining to the well layer. The thickness of the barrier layer 103b-1 was controlled to 20 nm. Another well layer 103a-2 formed of the aforementioned Ga$_{0.90}$In$_{0.10}$N having a multi-phase structure was provided on the barrier layer 103b-1. The thickness of the well layer 103a-2 was controlled to 8 nm, which is smaller than that of the well layer 103a-1, in order to form a band structure in which a conduction band and a valence band are bent, the band structure being advantageous for emitting long-wavelength light, when the well layer 103a-2 is joined to a barrier layer 103b-2 serving as the final end layer of the light-emitting layer 103 of the quantum well structure. Subsequently, the barrier layer 103b-2 serving as the final end layer of the light-emitting layer of the quantum well structure was provided so as to attain joining to the well layer 103a-2. The thickness of the barrier layer 103b-2 was controlled to 20 nm, which was identical to that of the barrier layer 103b-1.

After the light-emitting layer 103 of the quantum well structure had been formed by alternatively stacking a well layer and a barrier layer and performing the stacking twice, the temperature of the single-crystal substrate 101 was lowered to 450° C. in an atmosphere containing a nitrogen source (=NH$_3$) and hydrogen. Subsequently, a first amorphous layer 104 formed of undoped boron phosphide (BP) was provided so as to attain joining to the barrier layer 103b-2 serving as the final end layer of the light-emitting layer 103 of the quantum well structure. The amorphous layer was vapor-phase grown at a temperature lower than the barrier layer growth temperature and the well layer growth temperature. The first amorphous layer 104 formed of boron phosphide (BP) was provided through atmospheric-pressure MOCVD means employing a triethylborane (molecular formula: (C$_2$H$_5$)$_3$B)/phosphine (molecular formula: PH$_3$)/H$_2$ reaction system. The thickness of the first amorphous layer 104 was controlled to 15 nm. After formation of the first amorphous layer 104 was complete, the temperature of the single-crystal substrate 101 was elevated from 450° C. to 1,025° C. in an atmosphere containing a phosphorus source (=PH$_3$) and hydrogen.

Subsequently, through the same atmospheric-pressure MOCVD means employing a (C$_2$H$_5$)$_3$B/PH$_3$/H$_2$ reaction system and by use of the same vapor phase growth apparatus as described above, a second amorphous layer 105 was provided so as to attain joining to the first amorphous layer 104 at a temperature higher than the first amorphous layer 104 growth temperature. As the second amorphous layer 105 was vapor-phase grown at a V/III ratio (=PH$_3$/(C$_2$H$_5$)$_3$B) of 16, the second amorphous layer 105 assumed a p-type conduction layer which was stoichiometrically rich in boron (B) with respect to phosphorus (P). The thickness of the second amorphous layer 105 which had been vapor-phase grown at high temperature was controlled to 15 nm.

Subsequently, through the same atmospheric-pressure MOCVD means employing a (C$_2$H$_5$)$_3$B/PH$_3$/H$_2$ reaction system and by use of the same vapor phase growth apparatus, an upper cladding layer 106, formed of an undoped p-type boron phosphide single-crystal layer, was provided so as to attain joining to the second amorphous layer 105 at 1,025° C. The thickness of the undoped p-type boron phosphide single-crystal layer serving as the upper cladding layer 106 was controlled to 580 nm.

After the stacked structure 13 had been formed through the final vapor phase growth of the upper cladding layer 106, the stacked structure 13 was cooled to room temperature. Thereafter, the p-type upper cladding layer 106 and the light-emitting layer 103 were evaluated electrically and crystallographically. The p-type upper cladding layer 106 was found to have carrier concentration of $2 \times 10^{19}$ cm$^{-3}$, as measured through a conventional electrolytic C-V (capacitance-voltage) method. The value indicated that the upper cladding layer assumed a low-resistive p-type conduction layer in an as-grown state. The mean dislocation density of the layer, as determined through a conventional cross-sectional TEM technique, was found to be less than $1 \times 10^3$/cm$^2$, with the presence of a portion having a dislocation density of $1 \times 10^2$/cm$^2$ or less. The barrier layers 103b-1 and 103b-2 and the well layers 103a-1 and 103a-2 forming the light-emitting layer 103 were found to have an internal dislocation density of about $2 \times 10^{10}$ cm$^{-2}$. The thickness of each of the barrier layers and the well layers forming the light-emitting layer of the quantum well structure remained unchanged. Notably, no voids resulting from decomposition of GaN at high temperature was observed inside the barrier layer serving as the final end layer forming heterojunction with the amorphous layer. In particular, according to the Example, the first amorphous layer joined to the barrier layer serving as the final end layer of the quantum well structure, the second amorphous layer grown at higher temperature so as to attain joining to the first amorphous layer, and the upper cladding layer formed of p-type boron phosphide layer formed on the second amorphous layer serving as an underlying layer, were all formed from an undoped layer. Therefore, an increase in the degree of disorder in the junction interface between a barrier layer and a well layer due to diffusion of added impurities was found to be reduced.

A p-type electrode 204 was provided on a center of the p-type upper cladding layer 106 serving as the surface of the stacked structure 13. A bottom-side electrode 204a included in the p-type electrode 204 was formed of a gold-tin alloy (Au: 98% by weight, Sn: 2% by weight), forming non-Ohmic contact with a p-type boron phosphide single crystal. The bottom-side electrode 204a had a circular plane shape with a diameter of 130 μm. On the bottom-side electrode 204a, a p-type Ohmic electrode 204b formed of a gold-beryllium alloy (Au: 99% by weight, Be: 1% by weight) was provided. As shown in FIG. 4, the p-type Ohmic electrode 204b was formed of two stripe electrodes (width: 60 μm) perpendicular to each other. The crossing point defined by two stripe electrodes 204b perpendicular to each other and the center of the plane of the bottom-side electrode 204a were caused to be matched. In addition, the stripe electrodes 204b were caused to extend on a portion of a light emission area 205 of the LED 12 which was open to the outside. The bottom-side electrode 204a and the stripe electrodes 204b disposed on the bottom-side electrode 204a were coated with vacuum-vapor-deposited gold (Au) film 204c (thickness: about 1.7 μm), so as to provide a pad electrode for performing wire bonding. On the other hand, as shown in FIG. 4, an n-type electrode 108 was plasma-etched by use of a gas mixture of methane (molecular formula: CH$_4$)/argon (symbol of element: Ar)/H$_2$, whereby an unnecessary portion was removed to expose a potion of the lower cladding layer 102. The n-type electrode 108 was disposed on the exposed portion of the lower cladding layer 102 as shown in FIGS. 3 and 4.

Emission characteristics of the LED 12 which was equipped with the p-type electrode 204 of the aforementioned structure and which had a plane shape of a square having a side length of 300 μm were confirmed upon passage of device operation current in the forward direction. The LED 13 emitted blue light having an emission center wavelength of 442 nm, with a half-width value observed in the emission spectrum of 120 meV. Luminous intensity of the LED chip before being resin-molded, as determined through a conventional photometric sphere, was 7 mcd. Luminescent microspots, which have been conventionally generated through short-circuit-like flow of device operation current to the light-emitting layer 103 of the quantum well structure via dislocations, were not observed, because the p-type electrode 204 was provided so as to attain contact with the upper cladding layer 106 formed of p-type boron phosphide having a particularly low dislocation density. A near field light emission pattern indicated that emission intensity was uniform on virtually the entire portion of the surface of the emission area 205, which was open to the outside.

Furthermore, as the p-type electrode 204 was provided so as to attain contact with the upper cladding layer 106 formed of p-type boron phosphide having a low dislocation density, no local breakdown was observed. Thus, an LED 12 having excellent rectifying characteristics; i.e., the forward voltage (i.e., Vf) at a forward current of 20 mA was about 3 V and the reverse voltage (Vr) at a reverse current of 10 μA was about 8 V or more, was provided.

EXAMPLE 3

Figure 5:
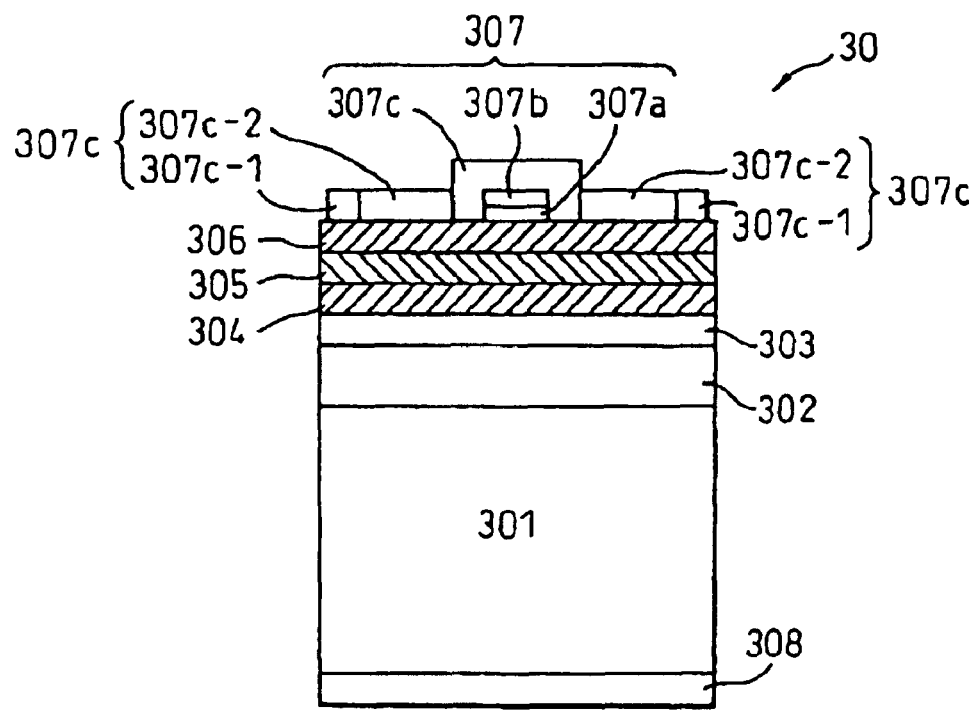
FIG. 5 is a schematic cross-sectional view of an LED described in Example 3.
Figure 6:
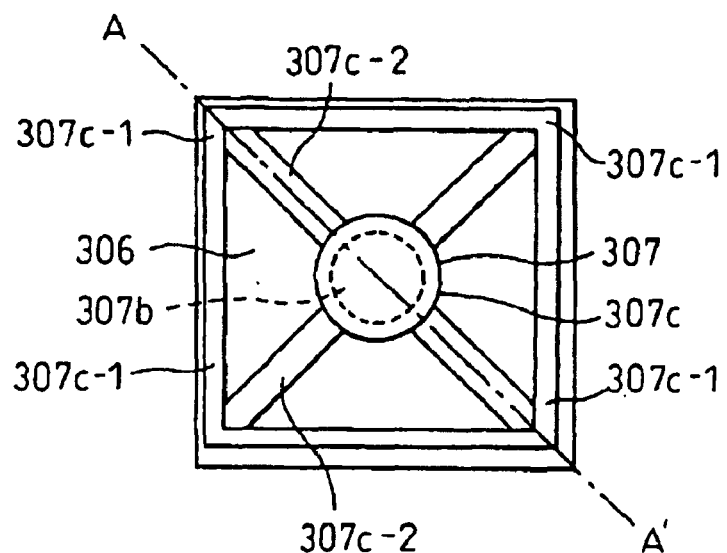
FIG. 6 is a schematic plane view of the LED shown in FIG. 5.

FIG. 5 is a schematic cross-sectional view of an LED 30 mentioned in this Example. FIG. 6 is a schematic plane view of the LED 30. The cross-section of FIG. 5 is a cross-section along the broken line A–A' shown in FIG. 6. A phosphorus (P)-doped n-type (111)-Si single crystal was used as a single-crystal substrate 301. Firstly, on the (111)-surface of the single-crystal substrate 301, a lower cladding layer 302 formed of undoped n-type monomeric boron phosphide (BP) was deposited through atmospheric pressure (near atmospheric pressure) metal-organic chemical vapor deposition (MOCVD) means. The n-type lower cladding layer 302 was formed at 950° C. by use of a triethylborane (molecular formula: (C$_2$H$_5$)$_3$B)/phosphine (molecular formula: PH$_3$)/hydrogen (H$_2$) reaction system. The thickness of the n-type lower cladding layer 302 was controlled to 240 nm so as to attain a reflectance of 40% or higher within a blue light wavelength range of 430 nm to 460 nm. Feeding of the aforementioned boron source was stopped so as to complete vapor phase growth of the n-type lower cladding layer 302. Thereafter, the temperature of the Si single-crystal substrate 301 was lowered to 825° C. in an atmosphere containing phosphine (PH$_3$) and hydrogen (H$_2$).

Subsequently, an n-type gallium indium nitride (Ga$_x$In$_{1-x}$N: $0 \leq x \leq 1$) layer serving as a light-emitting layer 303 was provided through atmospheric pressure MOCVD means by use of a trimethylgallium (molecular formula: (CH$_3$)$_3$Ga)/trimethylindium (molecular formula: (CH$_3$)$_3$In)/ammonia (molecular formula: NH$_3$)/H$_2$ reaction system so as to attain joining to the n-type lower cladding layer 302. The gallium indium nitride layer serving as the n-type light-emitting layer 303 was formed from a Ga$_x$In$_{1-x}$N layer having a multi-phase structure consisting of a plurality of phases having indium compositional proportions (=1-x) that differ from one another. The average composition of indium was found to be 0.06 (=6%). The thickness of the light-emitting layer 303 formed of n-type $Ga_{0.94}In_{0.06}N$ layer was controlled to 50 nm. Vapor phase growth of the n-type $Ga_{0.94}In_{0.06}N$ layer was completed by stopping the feed of $(CH_3)_3Ga$ and $(CH_3)_3In$.

Thereafter, the temperature of the single-crystal substrate 301 was elevated to 1,000° C. in an atmosphere containing $NH_3$ and $H_2$. Subsequently, on the light-emitting layer 303, a first amorphous layer 304 formed of an undoped boron phosphide layer was formed through atmospheric pressure MOCVD means by use of the aforementioned $(C_2H_5)_3B/PH_3/H_2$ reaction system. The first amorphous layer 304 was vapor-phase grown at a V/III ratio $(=PH_3/(C_2H_5)_3B)$ of 40. The boron phosphide amorphous layer vapor-phase grown under the conditions was found to have an acceptor concentration of $6 \times 10^{18}$ cm$^{-3}$, as measured through a conventional electrolytic C (capacitance)-V (voltage) method. The carrier (hole) concentration at room temperature, as measured through a conventional Hall effect method, was found to be of $4 \times 10^{17}$ cm$^{-3}$. The thickness of the first amorphous layer 304 was controlled to 12 nm.

Feeding of $(C_2H_5)_3B$ employed as a boron source was stopped so as to complete vapor phase growth of the first amorphous layer 304. Thereafter, the temperature of the single-crystal substrate 301 was elevated to 1,050° C. in the vapor phase growth zone where flow of $PH_3$ serving as a phosphorus source and $H_2$ was maintained. Subsequently, on the first amorphous layer 304, a second amorphous layer 305 formed of an undoped boron phosphide was formed through atmospheric pressure MOCVD means by use of the $(C_2H_5)_3B/PH_3/H_2$ reaction system. The second amorphous layer 305 was grown at a V/III ratio of 21 so as to attain a carrier (hole) concentration higher than that of the first amorphous layer 304. The undoped boron phosphide amorphous layer vapor-phase grown under the conditions was found to have an acceptor concentration of $1 \times 10^{20}$ cm$^{-3}$, as measured through a conventional electrolytic C (capacitance)-V (voltage) method. The carrier (hole) concentration at room temperature, as measured through a conventional Hall effect method, was found to be of $2 \times 10^{19}$ cm$^{-3}$. The thickness of the undoped second amorphous layer 305 was controlled to 12 nm.

Subsequently, on the second amorphous layer 305, an upper cladding layer 306 formed of undoped p-type boron phosphide was formed through atmospheric pressure MOCVD means at 1,025° C. by use of a $(C_2H_5)_3B/PH_3/H_2$ reaction system. The upper cladding layer 306 formed of p-type boron phosphide was vapor-phase grown at a V/III ratio of 21, which was higher than the ratio during growth of the first amorphous layer 304 and which was equal to the ratio during growth of the second amorphous layer 305. The upper cladding layer formed of undoped p-type boron phosphide was found to have an acceptor concentration of $2 \times 10^{20}$ cm$^{-3}$, as measured through a conventional electrolytic C (capacitance)-V (voltage) method. The carrier (hole) concentration at room temperature, as measured through a conventional Hall effect method, was found to be of $3 \times 10^{19}$ cm$^{-3}$. The resistivity of the layer was found to be $5 \times 10^{-2}$ Ω·cm. The thickness of the upper cladding layer 306 formed of p-type boron phosphide was controlled to 580 nm. Feeding of $(C_2H_5)_3B$ serving as a boron source was stopped so as to complete vapor phase growth of the upper cladding layer 306 formed of undoped p-type boron phosphide. Thereafter, the stacked structure was cooled to about 650° C. in an atmosphere containing $PH_3$ and $H_2$, followed by cooling to room temperature in hydrogen flow.

After completion of cooling, the boron phosphide amorphous layers 304 and 305 and the upper cladding layer 306 formed of p-type boron phosphide were analyzed in terms of crystal structure. The electron-beam diffraction patterns of the boron phosphide amorphous layers 304 and 305 were halos, and clear X-ray diffraction peaks did not appear. In the X-ray diffraction pattern of the upper cladding layer 306 formed of p-type boron phosphide, a (111)-diffraction peak attributed to the (111) crystal lattice of zincblende-type boron phosphide was observed as a main diffraction peak. In addition, subpeaks such as (311)and (110)-diffraction peaks also appeared. In the electron-beam diffraction pattern, a number of diffraction spots attributed to the 111-crystal lattice of boron phosphide appeared on the 111-diffraction ring. The results indicated that the upper cladding layer 306 formed of p-type boron phosphide was formed of a polycrystalline layer. Observation of the inside thereof through the cross-sectional TME technique revealed that the upper cladding layer 306 formed of p-type boron phosphide was a polycrystalline layer formed up of aggregated columnar (111)-crystals slightly deviating from the <110> crystal direction. The upper cladding layer 306 formed of p-type boron phosphide was made from polycrystalline up to the surface portions thereof, and included no single-crystal layer. In contrast, the surface portion of the n-type boron phosphide layer serving as the lower cladding layer 302 assumed a single-crystal layer having a (111)-crystal lattice.

Since the upper cladding layer 306 formed of polycrystalline boron phosphide had a low resistance, a troublesome thermal treatment for producing a low-resistance layer, which had conventionally been employed, was not performed, and a bottom-side electrode 107a formed of titanium (Ti) was provided on a center of the surface of the upper cladding layer. Through a conventional electron beam vapor deposition method, a titanium (symbol of element: Ti) electrode having a thickness of 60 nm was formed. On the bottom-side electrode 307a having the shape of a circular plane with a diameter of 130 μm, an intermediate layer 307b formed of platinum (symbol of element: Pt) was provided so as to attain contact with the bottom-side electrode. The platinum layer having a thickness of 30 nm serving as the intermediate layer 307b was formed through the electron beam vapor deposition method employed for forming the Ti electrode. In addition, a p-type Ohmic electrode 307c formed of a gold-beryllium (Au—Be) alloy was provided so as to attain contact with the intermediate layer 307b. The p-type Ohmic electrode 307c was placed around the bottom-side electrode 307a so as to attain contact with the surface of the upper cladding layer 306 formed of polycrystalline p-type boron phosphide. As shown in FIG. 6, on the surface of the upper cladding layer 306 formed of p-type boron phosphide, the Ohmic electrode 307c was arranged in a frame-form electrode 307c-1 provided at an external edge of the device and a stripe form electrode 307c-2. The line width of the Au—Be electrode for forming the frame electrode 307c-1 and the stripe electrode 307c-2 was adjusted to 60 μm. The p-type electrode 307 had a three-layer structure; i.e., Ti bottom-side electrode 307a/Pt intermediate layer 307b/Au—Be Ohmic electrode 307c.

An n-type Ohmic electrode 308 formed of an aluminum-antimony (Al—Sb) alloy was provided on the almost entire backside surface of the n-type (111)-silicon (Si) single-crystal substrate 301. Thus, an LED 30 having a pn-junction DH (double hetero) structure was fabricated. Upon passage of operation current (20 mA) in the forward direction between the p-type and n-type Ohmic electrodes 307 and 308, the LED 30 emitted bluish purple light having a wavelength of about 440 nm. Luminous intensity of the LED (as chip) as determined through a conventional photometric sphere was about 8 mcd. The device operation current, whose short-circuit-like flow to the light-emitting layer 303 directly below the p-type electrode 307 was inhibited through provision of the Schottky contact bottom-side electrode 307$a$, was diffused over the entire surface of the p-type upper cladding layer 306 via the p-type Ohmic electrode 307$c$. Therefore, light emission having a uniform intensity was provided from the virtually whole surface of the p-type cladding layer 306. Particularly, a variation in emission intensity caused by long-term passage of device operation current was not observed, as strain applied to the light-emitting layer 303 was relaxed through provision of polycrystalline boron phosphide layers. Excellent rectifying characteristics were attained; i.e., the forward voltage (i.e., Vf) at a forward current of 20 mA was about 3 V and the reverse voltage (Vr) at a reverse current of 10 $\mu$A was about 8 V or more.

According to the present invention, the p-type upper cladding layer is formed from a low-resistance p-type boron phosphide-based semiconductor layer, the layer being grown by the mediation of amorphous layers formed of boron phosphide-based semiconductor. Thus, a boron phosphide-based semiconductor light-emitting device which emits high-intensity light for a long period of time and which has excellent rectifying characteristics can be provided. A boron phosphide-based semiconductor light-emitting device according to the present invention is useful for a light-emitting diode and the like.

What is claimed is:

1. A boron phosphide-based semiconductor light-emitting device, which device includes a light-emitting member having a hetero-junction structure in which an n-type lower cladding layer formed of an n-type compound semiconductor, an n-type light-emitting layer formed of an n-type Group III nitride semiconductor, and a p-type upper cladding layer provided on the light-emitting layer and formed of a p-type boron phosphide-based semiconductor are sequentially provided on a surface of a conductive or high-resistive single-crystal substrate and which device includes a p-type electrode provided so as to achieve contact with the p-type upper cladding layer, characterized in that an amorphous layer formed of boron phosphide-based semiconductor is disposed between the p-type upper cladding layer and the n-type light-emitting layer.

2. A boron phosphide-based semiconductor light-emitting device according to claim 1, wherein the amorphous layer has a multilayer structure comprising a first amorphous layer being in contact with the light-emitting layer and a second amorphous layer being in contact with the p-type upper cladding layer and having a carrier concentration higher than that of the first amorphous layer.

3. A boron phosphide-based semiconductor light-emitting device according to claim 2, wherein the first amorphous layer is formed of a boron phosphide-based semiconductor grown at a temperature lower than the temperature at which the light-emitting layer is formed.

4. A boron phosphide-based semiconductor light-emitting device according to claim 2, wherein the first amorphous layer is formed of an undoped boron phosphide and has a thickness of 2 nm to 50 nm.

5. A boron phosphide-based semiconductor light-emitting device according to claim 2, wherein the second amorphous layer is formed of a p-type boron phosphide-based semiconductor grown at a temperature higher than the temperature at which the first amorphous layer is formed.

6. A boron phosphide-based semiconductor light emitting device according to claim 2, wherein the second amorphous layer is formed of an undoped amorphous p-type boron phosphide having an acceptor concentration at room temperature of $2\times10^{19}$ cm$^{-3}$ to $4\times10^{\circ}$ cm$^{-3}$, a carrier concentration at room temperature of $5\times10^{18}$ cm$^{-3}$ to $1\times10^{20}$ $^{cm-3}$, and a thickness of 2 nm to 450 nm.

7. A boron phosphide-based semiconductor light-emitting device according to claim 1, wherein the p-type upper cladding layer is formed of a p-type boron phosphide-based semiconductor having a dislocation density equal to or less than that of the Group III nitride semiconductor serving as the light-emitting layer.

8. A boron phosphide-based semiconductor light-emitting device according to claim 1, wherein the p-type upper cladding layer is formed of an undoped polycrystalline p-type boron phosphide having an acceptor concentration at room temperature of $2\times10^{19}$ cm$^{-3}$ to $4\times10^{\circ}$ cm$^{-3}$, a carrier concentration at room temperature of $5\times10^{18}$ cm$^{3}$ to $1\times10^{20}$ cm$^{-3}$, and a resistivity at room temperature of 0.1 $\Omega$·cm or less.

9. A boron phosphide-based semiconductor light-emitting device according to claim 1, wherein the p-type electrode provided on the p-type upper cladding layer is formed of a bottom-side electrode and a p-type Ohmic electrode; the bottom-side electrode in contact with the surface of the p-type upper cladding layer and being formed of a material able to form non-Ohmic contact with the p-type boron phosphide-based semiconductor serving as the p-type upper cladding layer; and the p-type Ohmic electrode being in electrical contact with the bottom-side electrode, extending so as to achieve contact also with the surface of the p-type upper cladding layer, and being in Ohmic contact with the p-type boron phosphide-based semiconductor.

10. A boron phosphide-based semiconductor light-emitting device according to claim 9, wherein the p-type Ohmic electrode is provided so as to extend, as a stripe electrode, on a portion of the surface of the p-type upper cladding layer where the bottom-side electrode is not provided.

11. A boron phosphide-based semiconductor light-emitting device according to claim 9, wherein the bottom-side electrode is formed of a gold-tin (Au—Sn) alloy or a gold-silicon (Au—Si) alloy.

12. A boron phosphide-based semiconductor light-emitting device according to claim 9, wherein the bottom-side electrode is formed of titanium (Ti).

13. A boron phosphide-based semiconductor light-emitting device according to claim 9, wherein the p-type Ohmic electrode is formed of a gold-beryllium (Au—Be) alloy or a gold-zinc (Au—Zn) alloy.

14. A boron phosphide-based semiconductor light-emitting device according to claim 9, wherein the p-type Ohmic electrode is formed of nickel (Ni) or a compound thereof.

15. A boron phosphide-based semiconductor light-emitting device according to claim 9, wherein an intermediate layer formed of a transition metal is provided between the p-type Ohmic electrode and the bottom-side electrode.

16. A boron phosphide-based semiconductor light-emitting device according to claim 15, wherein the intermediate layer is formed of molybdenum (Mo) or platinum (Pt).

17. A method for producing a boron phosphide-based semiconductor light-emitting device, the method including forming a light-emitting member having a hetero-junction structure in which an n-type lower cladding layer composed of an n-type compound semiconductor, an n-type light-emitting layer composed of an n-type Group III nitride semiconductor, and a p-type upper cladding layer composed of a p-type boron phosphide-based semiconductor and provided on the light-emitting layer are sequentially provided on a surface of a conductive or high-resistive single-crystal substrate, and forming a p-type Ohmic electrode so as to achieve contact with the p-type upper cladding layer, characterized in that the method comprises forming an amorphous layer composed of a boron phosphide-based semiconductor on the n-type light-emitting layer through a vapor phase growth method, and forming the p-type upper cladding layer composed of a p-type boron phosphide-based semiconductor layer on the amorphous layer through a vapor phase growth method.

18. A method for producing a boron phosphide-based semiconductor light-emitting device, the method including forming a light-emitting member having a hetero-junction structure in which an n-type lower cladding layer composed of an n-type compound semiconductor, an n-type light-emitting layer composed of an n-type Group III nitride semiconductor, and a p-type upper cladding layer composed of a p-type boron phosphide-based semiconductor and provided on the light-emitting layer are sequentially provided on a surface of a conductive or high-resistive single-crystal substrate, and forming a p-type Ohmic electrode so as to achieve contact with the p-type upper cladding layer, characterized in that the method comprises forming a first amorphous layer composed of boron phosphide-based semiconductor on the n-type light-emitting layer through a vapor phase growth method; forming a second amorphous layer composed of amorphous p-type boron phosphide-based semiconductor having a carrier concentration higher than that of the first amorphous layer through a vapor phase growth method such that the second amorphous layer is joined to the first amorphous layer; and forming the p-type upper cladding layer composed of a p-type boron phosphide-based semiconductor layer through a vapor phase growth method such that the upper cladding layer is joined to the second amorphous layer.

19. A method for producing a boron phosphide-based semiconductor light-emitting device according to claim 18, wherein the first amorphous layer is formed on the n-type light-emitting layer maintained at a temperature higher than 250° C. and lower than 750° C. through a vapor phase growth method at a concentration ratio of a boron-containing compound as a boron source to a phosphorus-containing compound as a phosphorus source fed to a vapor phase growth zone (V/III ratio) falling within a range of 0.2 to 50.

20. A method for producing a boron phosphide-based semiconductor light-emitting device according to claim 18, wherein the second amorphous layer is vapor-phase grown on the first amorphous layer maintained at a temperature of 1000° C. to 1250° C. at a V/III ratio higher than that employed in vapor phase growth of the first amorphous layer.

21. A method for producing a boron phosphide-based semiconductor light-emitting device according to claim 18, wherein the p-type upper cladding layer is vapor-phase grown at a temperature of 750° C. to 1200° C. at a V/III ratio falling within a range of 600 to 2,000.

22. A method for producing a boron phosphide-based semiconductor light-emitting device according to claim 18, wherein each of the first amorphous layer, the second amorphous layer, and the p-type upper cladding layer is composed of boron phosphide (BP).

23. A light-emitting diode comprising a boron phosphide-based semiconductor light-emitting device according to claim 1.

* * * * *